US011483004B2

(12) United States Patent
Park et al.

(10) Patent No.: US 11,483,004 B2
(45) Date of Patent: Oct. 25, 2022

(54) DELAY CIRCUIT AND A DELAY LOCKED LOOP CIRCUIT USING THE SAME

(71) Applicant: SK hynix Inc., Icheon-si (KR)

(72) Inventors: Gyu Tae Park, Icheon-si (KR); Young Ouk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/529,035

(22) Filed: Nov. 17, 2021

(65) Prior Publication Data

US 2022/0123755 A1  Apr. 21, 2022

Related U.S. Application Data

(63) Continuation-in-part of application No. 17/179,066, filed on Feb. 18, 2021, now Pat. No. 11,264,994.

(30) Foreign Application Priority Data

Oct. 19, 2020 (KR) .................. 10-2020-0134983

(51) Int. Cl.
*H03L 7/081* (2006.01)
*H03L 7/085* (2006.01)

(52) U.S. Cl.
CPC ............ *H03L 7/0816* (2013.01); *H03L 7/085* (2013.01); *H03L 7/0818* (2013.01)

(58) Field of Classification Search
CPC ....... H03L 7/0818; H03L 7/07; H03L 7/0814; H03L 7/0816; H03K 5/133
See application file for complete search history.

(56) References Cited

U.S. PATENT DOCUMENTS

| 8,624,644 | B2* | 1/2014 | Gomm | H03L 7/0818 327/158 |
| 8,648,635 | B2* | 2/2014 | Willey | G11C 7/222 327/158 |
| 9,197,202 | B2 | 11/2015 | Jang et al. | |
| 10,026,462 | B1* | 7/2018 | Ma | G11C 7/1093 |
| 10,056,909 | B1* | 8/2018 | Qi | H03L 7/0818 |
| 10,200,046 | B1* | 2/2019 | Leong | H03K 5/06 |
| 10,755,756 | B2* | 8/2020 | Ma | G11C 7/1087 |
| 2006/0001465 | A1* | 1/2006 | Kwak | H03L 7/0814 327/160 |
| 2007/0030753 | A1* | 2/2007 | Kwak | H03L 7/0816 365/233.11 |
| 2007/0183227 | A1* | 8/2007 | Kim | G11C 7/22 365/194 |
| 2007/0262798 | A1* | 11/2007 | Yun | H03L 7/0816 327/158 |

(Continued)

*Primary Examiner* — Adam D Houston
(74) *Attorney, Agent, or Firm* — William Park & Associates Ltd.

(57) ABSTRACT

A phase mixing circuit includes a first driver comprising 2n inverters configured to drive a first clock signal, where n is a positive integer, and a first selection circuit configured to couple each of the 2n inverters of the first driver to a first mixing node, on the basis of a weight having first to $2n^{th}$ bits. The phase mixing circuit also includes a second driver comprising 2n inverters configured to drive a second clock signal and a second selection circuit configured to couple each of the 2n inverters of the second driver to the first mixing node, on the basis of an inverted signal of the weight.

18 Claims, 13 Drawing Sheets

(56) References Cited

U.S. PATENT DOCUMENTS

| | | | | |
|---|---|---|---|---|
| 2008/0164920 A1* | 7/2008 | Cho | .................... | H03L 7/0816 |
| | | | | 327/158 |
| 2008/0174350 A1* | 7/2008 | Shin | .................... | H03L 7/0816 |
| | | | | 327/158 |
| 2009/0116602 A1* | 5/2009 | Kwon | .................... | H03L 7/00 |
| | | | | 375/372 |
| 2009/0289676 A1* | 11/2009 | Takai | .................... | H03K 5/13 |
| | | | | 327/158 |
| 2010/0182058 A1* | 7/2010 | Gomm | .................... | H03K 5/14 |
| | | | | 327/158 |
| 2010/0315147 A1* | 12/2010 | Booth | .................... | H03K 5/13 |
| | | | | 327/298 |
| 2011/0148486 A1* | 6/2011 | Mosalikanti | .......... | H03L 7/0812 |
| | | | | 327/295 |
| 2011/0234280 A1* | 9/2011 | Na | .................... | H03L 7/0816 |
| | | | | 327/158 |
| 2012/0154001 A1* | 6/2012 | Seo | .................... | H03L 7/0814 |
| | | | | 327/158 |
| 2013/0229214 A1* | 9/2013 | Ichida | ................ | G11C 7/1039 |
| | | | | 327/158 |
| 2014/0002149 A1* | 1/2014 | Jang | .................... | H03L 7/0816 |
| | | | | 327/158 |
| 2014/0021990 A1* | 1/2014 | Na | .................... | H03L 7/095 |
| | | | | 327/158 |
| 2016/0269012 A1* | 9/2016 | Takahashi | ............... | H03L 7/087 |
| 2022/0123755 A1* | 4/2022 | Park | .................... | H03L 7/0818 |

\* cited by examiner

US 11,483,004 B2

DELAY CIRCUIT AND A DELAY LOCKED LOOP CIRCUIT USING THE SAME

CROSS-REFERENCES TO RELATED APPLICATION

This application is a continuation-in-part of U.S. patent application Ser. No. 17/179,066, filed on Feb. 18, 2021, which claims priority under 35 U.S.C. 119(a) to Korean Application No. 10-2020-0134983, filed on Oct. 19, 2020, in the Korean Intellectual Property Office, which are incorporated herein by references in their entirety.

BACKGROUND

1. Technical Field

Various embodiments generally relate to an integrated circuit technology, and, more particularly, to a delay circuit for delaying a signal and a delay locked loop circuit using the same.

2. Related Art

An electronic device includes many electronic elements, and a computer system includes many semiconductor apparatuses each configured by a semiconductor. The semiconductor apparatuses configuring the computer system may communicate with each other by transmitting and receiving a clock signal and data. The semiconductor apparatuses may buffer or divide a system clock signal to generate internal clock signals having various phases. Because the semiconductor apparatuses generate the internal clock signals through various internal circuits, asynchronous delay may occur. Accordingly, a phase discrepancy may occur between the internal clock signal and the system clock signal. In general, a semiconductor apparatus may include a delay locked loop circuit in order to compensate for the asynchronous delay and generate the internal clock signal having a phase in synchronization with the system clock signal.

SUMMARY

In an embodiment, a phase mixing circuit may include: a first driver comprising 2n inverters configured to drive a first clock signal, where n is a positive integer; a first selection circuit configured to couple each of the 2n inverters of the first driver to a first mixing node, on the basis of a weight having first to $2n^{th}$ bits; a second driver comprising 2n inverters configured to drive a second clock signal; and a second selection circuit configured to couple each of the 2n inverters of the second driver to the first mixing node, on the basis of an inverted signal of the weight.

In an embodiment, a phase mixing circuit may include: a first driver comprising n inverters configured to drive a first clock signal, where n is a positive integer; a first selection circuit configured to couple each of the n inverters of the first driver to a first mixing node, on the basis of a weight having first to $2n^{th}$ bits and at least part of an inverted signal of the weight; a second driver comprising n inverters configured to drive a second clock signal; and a second selection circuit configured to couple each of the n inverters of the second driver to the first mixing node, on the basis of the weight and at least part of the inverted signal of the weight.

DETAILED DESCRIPTION

Figure 1:
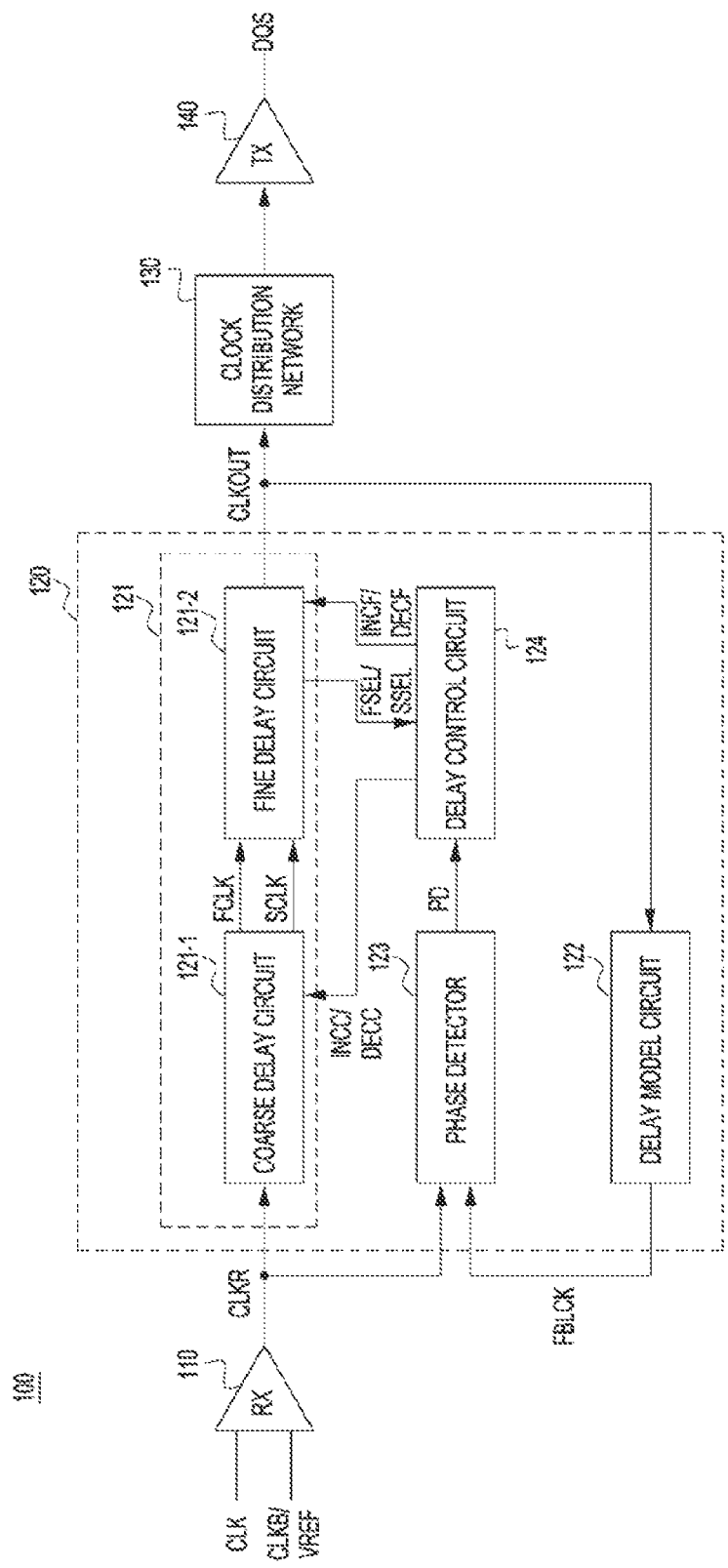
FIG. 1 is a diagram illustrating a configuration of a semiconductor apparatus in accordance with an embodiment.

FIG. 1 is a diagram illustrating a configuration of a semiconductor apparatus 100 in accordance with an embodiment. Referring to FIG. 1, the semiconductor apparatus 100 may include a clock receiver (RX) 110, a delay locked loop circuit 120, a clock distribution network 130, and a clock transmitter (TX) 140. The clock receiver 110 may receive a system clock signal CLK from an external apparatus (not illustrated). The clock receiver 110 may receive the system clock signal CLK to generate a reference clock signal CLKR. The system clock signal CLK may be a single-ended signal or a differential signal to be provided together with a complementary signal CLKB. When the system clock signal CLK is provided as a differential signal, the clock receiver 110 may differentially amplify the system clock signal CLK and the complementary signal CLKB to generate the reference clock signal CLKR.

When the system clock signal CLK is provided as a single-ended signal, the clock receiver 110 may differentially amplify the system clock signal CLK and a reference voltage VREF to generate the reference clock signal CLKR. The reference voltage VREF may have a level corresponding to a middle of a swing range of the system clock signal CLK.

The delay locked loop circuit 120 may be coupled to the clock receiver 110 and may receive the reference clock signal CLKR output from the clock receiver 110. The delay locked loop circuit 120 may perform a delay locking operation on the reference clock signal CLKR to generate an output clock signal CLKOUT. The semiconductor apparatus 100 may be synchronized with the system clock signal CLK to perform a data communication with the external apparatus. The semiconductor apparatus 100 may receive the system clock signal CLK to generate a transmission clock signal DQS and may transmit, in synchronization with the transmission clock signal DQS, data to the external apparatus. However, the system clock signal CLK may be delayed by an internal circuit of the semiconductor apparatus 100. Therefore, the semiconductor apparatus 100 compensates for a delay amount that may occur on a path from a point where the system clock signal CLK is received to a point where the transmission clock signal DQS is output. In order to compensate for the delay amount, the delay locked loop circuit 120 may variably delay the reference clock signal CLKR to generate the output clock signal CLKOUT.

The dock distribution network 130 may receive the output clock signal CLKOUT and may transmit the output clock signal CLKOUT to the clock transmitter 140. The clock transmitter 140 may drive the clock signal, which is provided from the dock distribution network 130, to output the transmission clock signal DQS to the external apparatus. Although the single dock transmitter 140 is illustrated in FIG. 1, the semiconductor apparatus 100 may include a plurality of data channels and/or pads, each of which is provided with the clock transmitter. The clock distribution network 130 may transmit the output clock signal CLKOUT, which is generated from the delay locked loop circuit 120, to each of the plurality of the clock transmitters.

The delay locked loop circuit 120 may include a delay circuit 121, a delay model circuit 122, a phase detector 123, and a delay control circuit 124. The delay circuit 121 may receive the reference clock signal CLKR and may delay the reference clock signal CLKR to generate the output clock signal CLKOUT. The delay circuit 121 may variably delay the reference clock signal CLKR based on delay control signals. The delay control signals may be control signals for changing and/or updating a delay time of the delay circuit 121. The delay circuit 121 may include a coarse delay circuit 121-1 and a fine delay circuit 121-2. The delay control signals may include coarse control signals INCC and DECC and fine control signals INCF and DECF. The delay time of the coarse delay circuit 121-1 may be set on the basis of the coarse control signals INCC and DECC. The coarse delay circuit 121-1 may receive the reference clock signal CLKR and may delay the reference clock signal CLKR by the set delay time to generate a first clock signal FCLK and a second clock signal SCLK. The second clock signal SCLK may be a complementary clock signal of the first clock signal FCLK and may have a complementary phase difference (i.e., 180°) with respect to the first clock signal FCLK. The delay time of the fine delay circuit 121-2 may be set on the basis of the fine control signals INCF and DECF. The fine delay circuit 121-2 may include a phase mixing circuit and may adjust a weight of the phase mixing circuit based on the fine control signals INCF and DECF. The fine delay circuit 121-2 may receive the first clock signal FCLK and the second clock signal SCLK and may mix phases of the first clock signal FCLK and the second clock signal SCLK based on the weight adjusted on the basis of the fine control signals INCF and DECF, to generate the output clock signal CLKOUT.

A unit delay time of the coarse delay circuit 121-1 may be longer than a unit delay time of the fine delay circuit 121-2. The delay locked loop circuit 120 may perform a coarse delay locking operation and a fine delay locking operation. The coarse delay locking operation may be an operation for setting the delay time of the coarse delay circuit 121-1 based on a phase detection result of the phase detector 123. The fine delay locking operation may be an operation for setting the delay time of the fine delay circuit 121-2 based on the phase detection result of the phase detector 123. The fine delay locking operation may be performed after completion of the coarse delay locking operation. During the fine delay locking operation, the delay time of the coarse delay circuit 121-1, which is set through the coarse delay locking operation, may be additionally changed.

A phase which is changed according to the unit delay time of the coarse delay circuit 121-1 may correspond to double a unit phase. Whenever the delay time is updated according to the coarse control signals INCC and DECC, the coarse delay circuit 121-1 may change stepwise the phases of the first clock signal FCLK and the second clock signal SCLK by an amount of double the unit phase. The fine delay circuit 121-2 may receive the first clock signal FCLK and the second clock signal SCLK, may generate two phase clock signals having a phase difference corresponding to half of the unit phase and may generate the output clock signal CLKOUT by mixing the phases of the two phase clock signals. The unit phase will be described later.

The delay model circuit 122 may receive the output clock signal CLKOUT and may delay the output clock signal CLKOUT by a modelled delay time, to generate a feedback clock signal FBCLK. For an embodiment, the modelled delay time refers to the delay time by the delay model circuit 122. The delay time of the delay model circuit 122 may be set to be substantially the same as a delay time which occurs on a clock path of the semiconductor apparatus 100. The delay model circuit 122 may have a delay amount corresponding to the delay amount which occurs traversing a path from a point where the system clock signal CLK is received to a point where the transmission clock signal DQS is output. The delay model circuit 122 may include circuits and/or elements, which are modelled on circuits existing on the path from a point where the system clock signal CLK is received to a point where the transmission clock signal DQS is output.

The phase detector 123 may receive the reference clock signal CLKR and the feedback clock signal FBCLK. The phase detector 123 may detect the phases of the reference clock signal CLKR and the feedback clock signal FBCLK to generate a phase detection signal PD. For example, the phase detector 123 may compare the reference clock signal CLKR with the feedback clock signal FBCLK to determine whether the reference clock signal CLKR has a phase leading or lagging behind the feedback clock signal FBCLK. When the reference clock signal CLKR has a phase leading the feedback clock signal FBCLK, the phase detector 123 may generate the phase detection signal PD having a first logic level. When the reference clock signal CLKR has a phase lagging behind the feedback clock signal FBCLK, the phase detector 123 may generate the phase detection signal PD having a second logic level. For example, the first logic level may be a high logic level and the second logic level may be a low logic level.

The delay control circuit 124 may receive the phase detection signal PD from the phase detector 123. The delay control circuit 124 may generate the delay control signal based on the phase detection signal PD. The delay control circuit 124 may generate the coarse control signals INCC and DECC based on the phase detection signal PD during the coarse delay locking operation and may generate the fine control signals INCF and DECF based on the phase detection signal PD during the fine delay locking operation. The coarse control signals INCC and DECC may include a coarse increase signal INCC and a coarse decrease signal DECC. The coarse increase signal INCC may be a signal for increasing the delay time of the coarse delay circuit 121-1. The coarse decrease signal DECC may be a signal for decreasing the delay time of the coarse delay circuit 121-1. The coarse delay circuit 121-1 may increase an amount of time by which the reference clock signal CLKR is delayed based on the coarse increase signal INCC. Each phase of the first clock signal FCLK and the second clock signal SCLK may be delayed by an amount of double the unit phase. The coarse delay circuit 121-1 may decrease an amount of time by which the reference clock signal CLKR is delayed based on the coarse decrease signal DECC. Each phase of the first clock signal FCLK and the second clock signal SCLK may advance by an amount of double the unit phase. The fine control signals INCF and DECF may include a fine increase signal INCF and a fine decrease signal DECF. Based on the fine increase signal INCF and the fine decrease signal DECF, the fine delay circuit 121-2 may change the weight for mixing the phases of the first clock signal FCLK and the second clock signal SCLK.

Based on the fine increase signal INCF and the fine decrease signal DECF, the fine delay circuit 121-2 may generate a first clock selecting signal FSEL and a second dock selecting signal SSEL. As previously described, the fine delay circuit 121-2 may receive the first clock signal FCLK and the second clock signal SCLK and may generate, from the first clock signal FCLK and the second clock signal SCLK, the two phase clock signals having the phase difference corresponding to half of the unit phase. Based on the first clock selecting signal FSEL and the second clock selecting signal SSEL, the delay control circuit 124 may generate the coarse increase signal INCC and the coarse decrease signal DECC. Based on the first clock selecting signal FSEL and the second clock selecting signal SSEL, the delay control circuit 124 may generate the coarse increase signal INCC and the coarse decrease signal DECC to continuously change the phase of the output clock signal CLKOUT generated from the fine delay circuit 121-2 by half of the unit phase.

Figure 2:
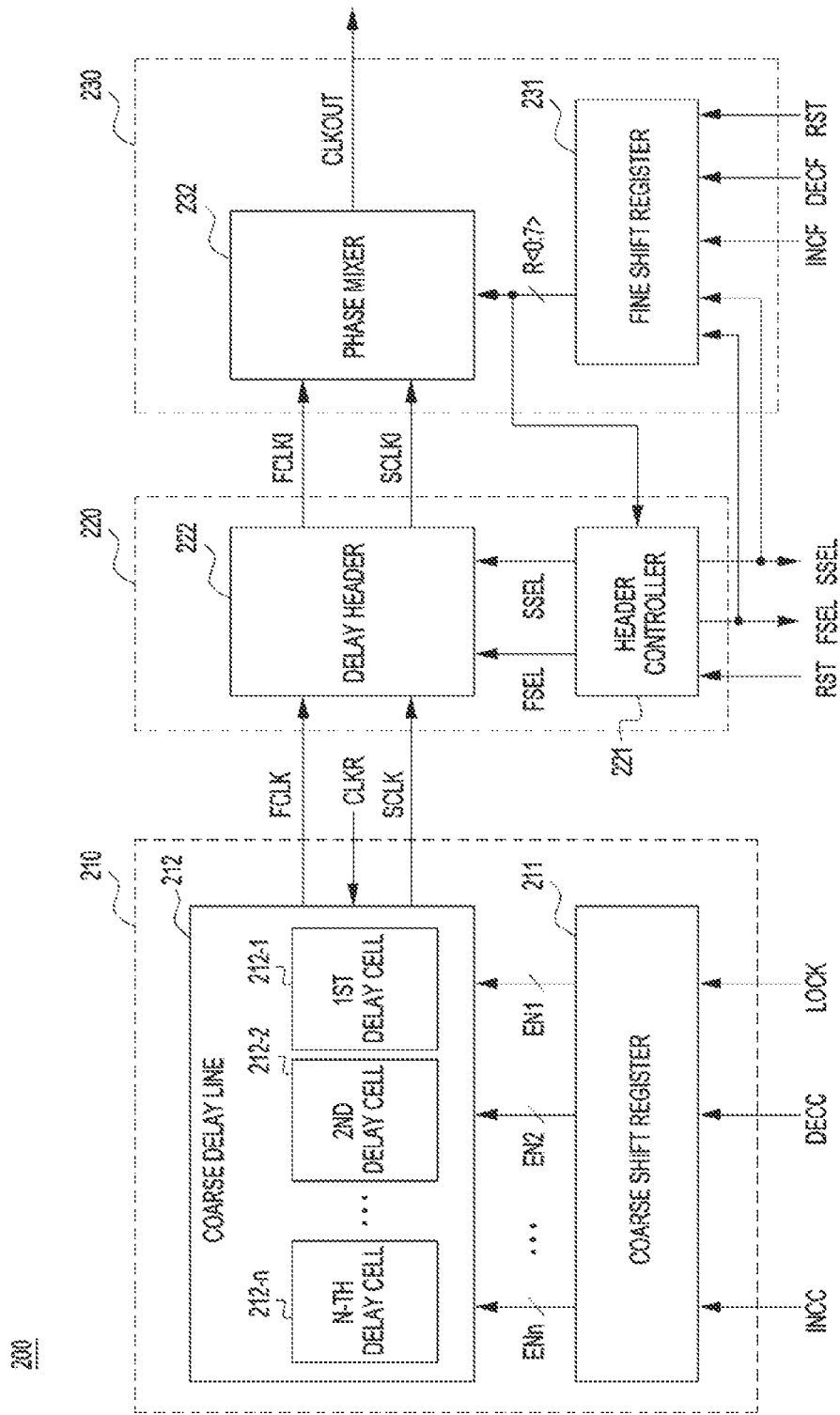
FIG. 2 is a diagram illustrating a configuration of a delay circuit in accordance with an embodiment.

FIG. 2 is a diagram illustrating a configuration of a delay circuit 200 in accordance with an embodiment. The delay circuit 200 may be applied as the delay circuit 121 illustrated in FIG. 1. Referring to FIG. 2, the delay circuit 200 may include a coarse delay circuit 210, a header circuit 220, and a phase mixing circuit 230. The header circuit 220 and the phase mixing circuit 230 may configure the fine delay circuit 121-2. The coarse delay circuit 210 may include a coarse shift register 211 and a coarse delay line 212. Based on the coarse control signals INCC and DECC, the coarse shift register 211 may generate first to n-th enable signals EN1 to ENn, 'n' being 3 or a greater integer. The number of the first to n-th enable signals EN1 to ENn may correspond to the number of delay cells provided within the coarse delay line 212. When receiving the coarse increase signal INCC, the coarse shift register 211 may increase the number of enable signals to be enabled among the first to n-th enable signals EN1 to ENn. When receiving the coarse decrease signal DECC, the coarse shift register 211 may decrease the number of enable signals to be enabled among the first to n-th enable signals EN1 to ENn. The coarse shift register 211 may sequentially increase or decrease the number of enable signals to be enabled among the first to n-th enable signals EN1 to ENn. For example, the coarse shift register 211 might enable only the first enable signal EN1 in an initial state. When receiving the coarse increase signal INCC, the coarse shift register 211 may enable the second enable signal EN2 together with the first enable signal EN1. Whenever receiving the coarse increase signal INCC, the coarse shift register 211 increases one by one the number of enable signals to be enabled among the first to n-th enable signals EN1 to ENn. Whenever receiving the coarse decrease signal DECC, the coarse shift register 211 decrease one by one the number of enable signals to be enabled among the first to n-th enable signals EN1 to ENn.

The coarse delay line 212 may receive the reference clock signal CLKR and may delay the reference clock signal CLKR to generate the first clock signal FCLK and the second clock signal SCLK. The coarse delay line 212 may include first to n-th delay cells 212-1 to 212-n. Each of the first to n-th delay cells 212-1 to 212-n may have a delay time corresponding to the unit delay time of the coarse delay line 212. The delay time of the coarse delay line 212 may change according to the number of delay cells to be activated. The delay time of a single delay cell may correspond to double of the unit phase. Based on the first to n-th enable signals EN1 to ENn, the coarse delay line 212 may change the number of delay cells to be activated. The first delay cell 212-1 may be activated on the basis of the first enable signal EN1. The second delay cell 212-2 may be activated on the basis of the second enable signal EN2. The n-th delay cell 212-n may be activated on the basis of the n-th enable signal ENn. The first delay cell 212-1 may receive the reference clock signal CLKR and may output the first clock signal FCLK and the second clock signal SCLK. As the second to n-th delay cells 212-2 to 212-n are sequentially activated, a path that the reference clock signal CLKR travels may become longer and therefore a delay time of the reference clock signal CLKR may increase. As the second to n-th delay cells 212-2 to 212-n are sequentially deactivated, the path that the reference clock signal CLKR travels may become shorter and therefore the delay time of the reference clock signal CLKR may decrease.

As described later, each of the first to n-th enable signals EN1 to ENn may include an up-enable signal and a down-enable signal. The up-enable signal may be a signal for increasing an amount of time required for the reference clock signal CLKR to be output as the first clock signal FCLK. The down-enable signal may be a signal for increasing an amount of time required for the reference clock signal CLKR to be output as the second clock signal SCLK. During the coarse delay locking operation, the coarse shift register 211 enables or disables all the up-enable signals and the down-enable signals based on the coarse increase signal INCC and the coarse decrease signal DECC. During the fine delay locking operation, the coarse shift register 211 enables or disables, one by one and sequentially, the up-enable signals and the down-enable signals based on the coarse increase signal INCC and the coarse decrease signal DECC. For example, it is assumed that only the first enable signal EN1 is enabled through the coarse delay locking operation. When receiving the coarse increase signal INCC during the fine delay locking operation, the coarse shift register 211 may first enable the up-enable signal of the second enable signal EN2. When receiving the coarse increase signal INCC again, the coarse shift register 211 may then enable the down-enable signal of the second enable signal EN2. When receiving the coarse decrease signal DECC during the fine delay locking operation, the coarse shift register 211 may first disable the down-enable signal of the first enable signal EN1. When receiving the coarse decrease signal DECC again, the coarse shift register 211 may then disable the up-enable signal of the first enable signal EN1. The coarse shift register 211 may further receive a locking signal LOCK. The locking signal LOCK may be enabled when the coarse delay locking operation is completed. Therefore, the coarse delay locking operation may be performed while the locking signal LOCK is disabled, and the fine delay locking operation may be performed while the locking signal LOCK is enabled. When the locking signal LOCK is disabled, the coarse shift register 211 may enable or disable all the up-enable signals and the down-enable signals based on the coarse increase signal INCC and the coarse decrease signal DECC. When the locking signal LOCK is enabled, the coarse shift register 211 enables or disables, one by one and sequentially, the up-enable signals and the down-enable signals based on the coarse increase signal INCC and the coarse decrease signal DECC.

The header circuit 220 may receive the first clock signal FCLK and the second clock signal SCLK and may generate a first phase clock signal FCLKI and a second phase clock signal SCLKI from the first clock signal FCLK and the second clock signal SCLK. A phase difference between the first phase clock signal FCLKI and the second phase clock signal SCLKI may correspond to half of the unit phase. Based on the fine increase signal INCF and the fine decrease signal DECF, the header circuit 220 may generate the first phase clock signal FCLKI having a phase leading the second phase clock signal SCLKI by an amount of half of the unit phase or may generate the first phase clock signal FCLKI having a phase lagging behind the second phase clock signal SCLKI by an amount of half of the unit phase.

The phase mixing circuit 230 may receive the first phase clock signal FCLKI, the second phase clock signal SCLKI, the fine increase signal INCF, and the fine decrease signal DECF. Based on the fine increase signal INCF and the fine decrease signal DECF, the phase mixing circuit 230 may determine the weight R<0:7> for mixing the phases of the first phase clock signal FCLKI and the second phase clock signal SCLKI. According to the weight R<0:7>, the phase mixing circuit 230 may mix the phases of the first phase clock signal FCLKI and the second phase clock signal SCLKI to generate the output clock signal CLKOUT. For example, the phase mixing circuit 230 may generate the output clock signal CLKOUT having a phase close to the phase of the first phase clock signal FCLKI as a value of the weight R<0:7> becomes greater and may generate the output clock signal CLKOUT having a phase close to the phase of the second phase clock signal SCLKI as the value of the weight R<0:7> becomes smaller.

The header circuit 220 may include a header controller 221 and a delay header 222. The header controller 221 may receive the weight R<0:7> determined on the basis of the fine increase signal INCF and the fine decrease signal DECF. Based on the weight R<0:7>, the header controller 221 may generate the first clock selecting signal FSEL and the second clock selecting signal SSEL. The header controller 221 may provide the delay header 222 with the first clock selecting signal FSEL and the second clock selecting signal SSEL. Referring to FIGS. 1 and 2, the header controller 221 may provide the delay control circuit 124 with the first clock selecting signal FSEL and the second clock selecting signal SSEL. Whenever the weight R<0:7> has its maximum value, the header controller 221 may change a logic level of the first clock selecting signal FSEL to its opposite logic level. Whenever the weight R<0:7> has its minimum value, the header controller 221 may change a logic level of the second clock selecting signal SSEL to its opposite logic level. The header controller 221 may further receive a reset signal RST. Based on the reset signal RST, the header controller 221 may initialize the first clock selecting signal FSEL and the second clock selecting signal SSEL to have a first logic level. The reset signal RST may be enabled when the coarse delay locking operation is completed and the fine delay locking operation starts.

In the initial state, each of the first clock selecting signal FSEL and the second clock selecting signal SSEL may have the first logic level. When any one of the first clock selecting signal FSEL and the second clock selecting signal SSEL transitions from a second logic level to the first logic level, the delay control circuit 124 may generate the coarse increase signal INCC and the coarse decrease signal DECC. When any one of the first clock selecting signal FSEL and the second clock selecting signal SSEL transitions from the second logic level to the first logic level and the phase detection signal PD has a first logic level, the delay control circuit 124 may generate the coarse increase signal INCC, and the coarse delay circuit 210 may increase the delay time of the coarse delay line 212. When any one of the first clock selecting signal FSEL and the second clock selecting signal SSEL transitions from the second logic level to the first logic level and the phase detection signal PD has a second logic level, the delay control circuit 124 may generate the coarse decrease signal DECC, and the coarse delay circuit 210 may decrease the delay time of the coarse delay line 212.

The delay header 222 may receive the first clock signal FCLK and the second clock signal SCLK from the coarse delay circuit 210 and may receive the first clock selecting signal FSEL and the second clock selecting signal SSEL from the header controller 221. Based on the first clock selecting signal FSEL, the delay header 222 may generate the first phase clock signal FCLKI from one of the first clock signal FCLK and a first delayed clock signal, which is the first clock signal FCLK delayed by an amount of the unit phase. Based on the second clock selecting signal SSEL, the delay header 222 may generate the second phase clock signal SCLKI from one of an inverted clock signal, which is the second clock signal SCLK inversely driven, and a second delayed clock signal, which is the inverted clock signal delayed by an amount of the unit phase.

The phase mixing circuit 230 may include a fine shift register 231 and a phase mixer 232. The fine shift register 231 may receive the fine increase signal INCF and the fine decrease signal DECF to generate the weight R<0:7>. Based on the fine increase signal INCF and the fine decrease signal DECF, the fine shift register 231 may change the weight R<0:7>. The fine shift register 231 may decrease or increase the value of the weight R<0:7> stepwise based on the fine increase signal INCF and may increase or decrease the value of the weight R<0:7> stepwise based on the fine decrease signal DECF. The weight R<0:7> may be a digital signal having a plurality of bits. The logic value of the weight R<0:7> may be increased or decreased in the same way as a thermometer code. If the fine increase signal INCF is continuously generated a number of times corresponding to a number exceeding the number of bits of the weight R<0:7>, the fine shift register 231 may decrease the weight R<0:7>, and when the weight R<0:7> reaches its minimum value, the fine shift register 231 may increase the weight R<0:7> again. If the fine decrease signal DECF is continuously generated a number of times corresponding to a number exceeding the number of bits of the weight R<0:7>, the fine shift register 231 may increase the weight R<0:7>, and when the weight R<0:7> reaches its maximum value, the fine shift register 231 may decrease the weight R<0:7> again.

The fine shift register 231 may further receive the reset signal RST. Based on the reset signal RST, the fine shift register 231 may initialize the weight R<0:7>, For example, when the reset signal RST is enabled, the fine shift register 231 may initialize the weight R<0:7> to have its maximum value. The fine shift register 231 may further receive the first clock selecting signal FSEL and the second clock selecting signal SSEL from the header controller 221. The fine shift register 231 may change the value of the weight R<0:7> based on the fine increase signal INCF, the fine decrease signal DECF, the first clock selecting signal FSEL, and the second clock selecting signal SSEL. For example, when the first clock selecting signal FSEL is enabled, the fine shift register 231 may decrease the value of the weight R<0:7> based on the fine increase signal INCF. For example, when the first clock selecting signal FSEL is disabled, the fine shift register 231 may increase the value of the weight R<0:7> based on the fine increase signal INCF. For example, when the second clock selecting signal SSEL is enabled, the fine shift register 231 may increase the value of the weight R<0:7> based on the fine decrease signal DECF. For example, when the second clock selecting signal SSEL is disabled, the fine shift register 231 may decrease the value of the weight R<0:7> based on the fine decrease signal DECF.

The phase mixer 232 may receive the first phase clock signal FCLKI and the second phase clock signal SCLKI from the header circuit 220 and the weight R<0:7> from the fine shift register 231. Based on the weight R<0:7>, the phase mixer 232 may mix the phases of the first phase clock signal FCLKI and the second phase clock signal SCLKI to generate the output clock signal CLKOUT. The phase mixer 232 may include any known phase mixer configured to mix, according to a weight, phases of two input clock signals to generate an output clock signal.

Figure 3:
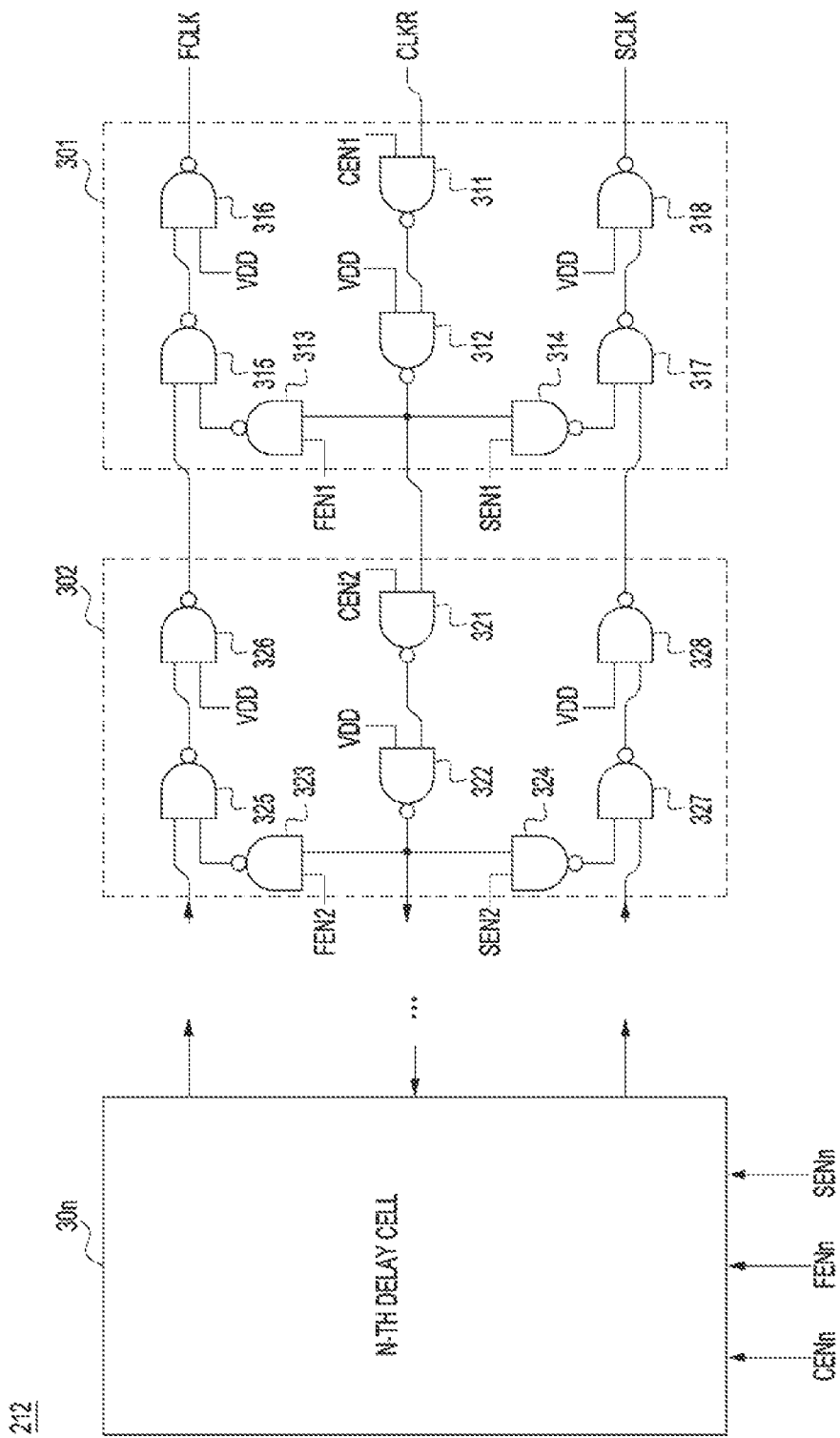
FIG. 3 is a diagram illustrating a configuration of a coarse delay line illustrated in FIG. 2.

FIG. 3 is a diagram illustrating a configuration of the coarse delay line 212 illustrated in FIG. 2. Referring to FIG. 3, the coarse delay line 212 may include first to n-th delay cells 301 to 30n. The first delay cell 301 may receive the reference clock signal CLKR, and the first to n-th delay cells 301 to 30n may sequentially delay the reference clock signal CLKR. Each of the first to n-th delay cells 301 to 30n may include eight NAND gates. Each of the first to n-th enable signals EN1 to ENn may include a plurality of enable signals. Each of the first to n-th enable signals EN1 to ENn may include a cell enable signal, the up-enable signal and the down-enable signal.

The first delay cell 301 may include first to eighth NAND gates 311 to 318. The first NAND gate 311 may receive a first cell enable signal CEN1 and the reference clock signal CLKR. The second NAND gate 312 may receive an output of the first NAND gate 311 and a power voltage VDD. The power voltage VDD may have a voltage level sufficient to be determined as a high logic level. The third NAND gate 313 may receive an output of the second NAND gate 312 and a first up-enable signal FEN1. The fourth NAND gate 314 may receive an output of the second NAND gate 312 and a first down-enable signal SEN1. The fifth NAND gate 315 may receive an output of the third NAND gate 313 and a signal output from the second delay cell 302. The sixth NAND gate 316 may receive an output of the fifth NAND gate 315 and the power voltage VDD and may output the first clock signal FCLK. The seventh NAND gate 317 may receive an output of the fourth NAND gate 314 and the signal output from the second delay cell 302. The eighth NAND gate 318 may receive an output of the seventh NAND gate 317 and the power voltage VDD and may output the second clock signal SCLK.

The second delay cell 302 may include first to eighth NAND gates 321 to 328. The first NAND gate 321 may receive a second cell enable signal CEN2 and the output of the second NAND gate 312 of the first delay cell 301. The second NAND gate 322 may receive an output of the first NAND gate 321 and the power voltage VDD. The third NAND gate 323 may receive an output of the second NAND gate 322 and a second up-enable signal FEN2. The fourth NAND gate 324 may receive an output of the second NAND gate 322 and a second down-enable signal SEN2. The fifth NAND gate 325 may receive an output of the third NAND gate 323 and a signal output from the delay cell disposed at the next stage. The sixth NAND gate 326 may receive an output of the fifth NAND gate 325 and the power voltage VDD and may output the signal input to the fifth NAND gate 315 of the first delay cell 301. The seventh NAND gate 327 may receive an output of the fourth NAND gate 324 and the signal output from the delay cell disposed at the next stage. The eighth NAND gate 328 may receive an output of the seventh NAND gate 327 and the power voltage VDD and may output the signal input to the seventh NAND gate 317 of the first delay cell 301. The n-th delay cell 30n may have the same structure as each of the first delay cell 301 and the second delay cell 302 except that each of fifth and seventh NAND gates receives the power voltage VDD instead of the signal output from the delay cell disposed at the next stage.

Referring to FIGS. 2 and 3, when the first enable signal EN1 is enabled and the second to n-th enable signals EN2 to ENn are disabled by the coarse shift register 211, the first cell enable signal CEN1, the first up-enable signal FEN1, and the first down-enable signal SEN1 may be enabled. Therefore, the reference clock signal CLKR may be delayed only by the first delay cell 301. The reference clock signal CLKR may be output as the first clock signal FCLK sequentially through the first NAND gate 311, the second NAND gate 312, the third NAND gate 313, the fifth NAND gate 315, and the sixth NAND gate 316. The reference clock signal CLKR may be output as the second clock signal SCLK sequentially through the first NAND gate 311, the second NAND gate 312, the fourth NAND gate 314, the seventh NAND gate 317, and the eighth NAND gate 318. When the second enable signal EN2 is also enabled by the coarse shift register 211, the second cell enable signal CEN2, the second up-enable signal FEN2, and the second down-enable signal SEN2 may also be enabled. Therefore, the reference clock signal CLKR may be delayed by the first delay cell 301 and the second delay cell 302. The reference clock signal CLKR may be output as the first clock signal FCLK sequentially through the first NAND gate 311 and the second NAND gate 312 of the first delay cell 301 and the first NAND gate 321, the second NAND gate 322, the third NAND gate 323, the fifth NAND gate 325, and the sixth NAND gate 326 of the second delay cell 302, and the fifth NAND gate 315 and the sixth NAND gate 316 of the first delay cell 301. The reference clock signal CLKR may be output as the second clock signal SCLK sequentially through the first NAND gate 311 and the second NAND gate 312 of the first delay cell 301 and the first NAND gate 321, the second NAND gate 322, the fourth NAND gate 324, the seventh NAND gate 327, and the eighth NAND gate 328 of the second delay cell 302, and the seventh NAND gate 317 and the eighth NAND gate 318 of the first delay cell 301. The reference dock signal CLKR may be delayed by the five NAND gates of the first delay cell 301 to be output as the first clock signal FCLK and the second clock signal SCLK. The reference clock signal CLKR may be delayed by the nine NAND gates of the first delay cell 301 and the second delay cell 302 to be output as the first clock signal FCLK and the second clock signal SCLK. Therefore, the unit delay time of each of the first to n-th delay cells 301 to 30n may be an amount of a 4-gate delay. The unit phase may be an amount of a 2-gate delay. An amount of phase that is changed within the unit delay time of each of the first to n-th delay cells 301 to 30n may be double the unit phase. As a number of activated delay cells increases one by one, the delay time of the reference clock signal CLKR may increase by an amount of a 4-gate delay. As a number of activated delay cells decreases one by one, the delay amount of the reference clock signal CLKR may decrease by an amount of a 4-gate delay.

Figure 4:
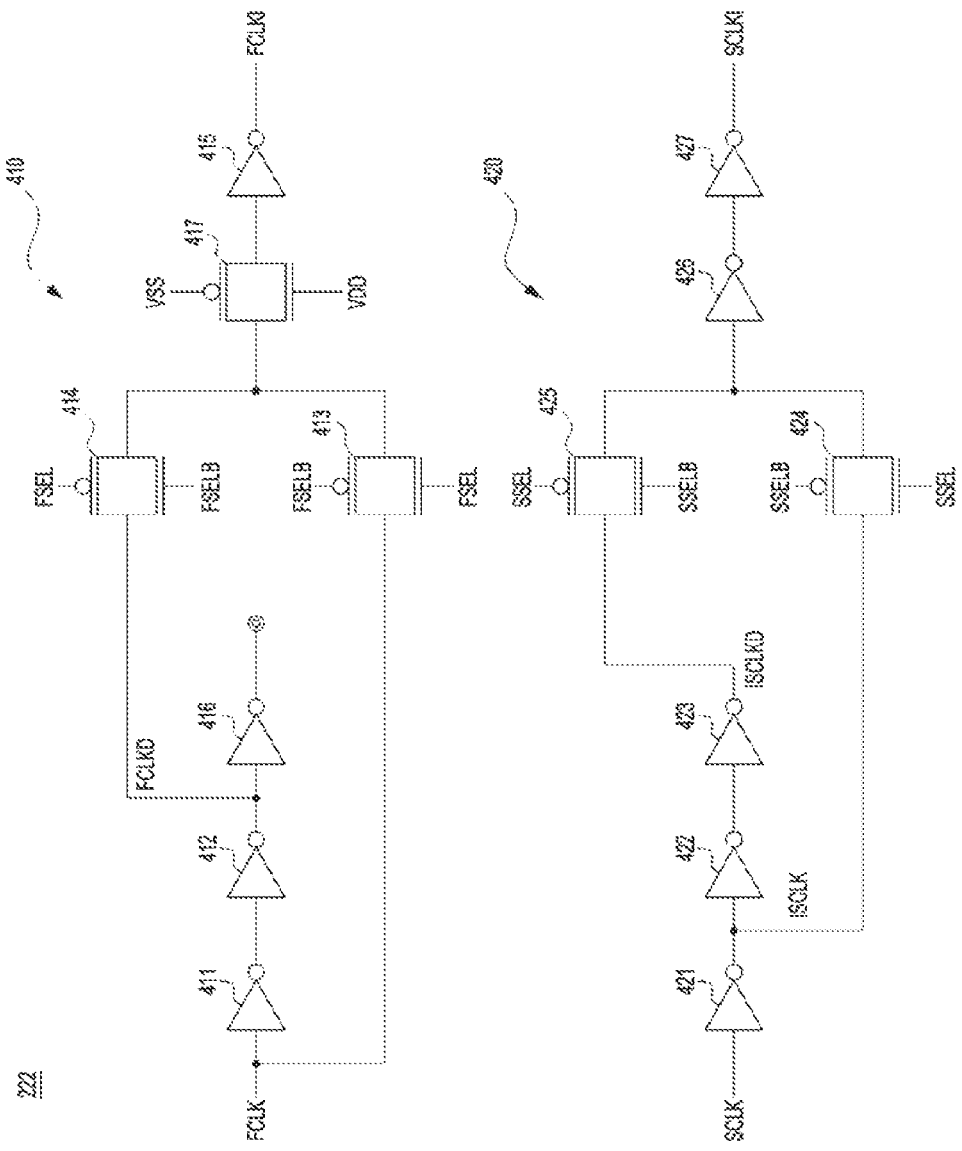
FIG. 4 is a diagram illustrating a configuration of a delay header illustrated in FIG. 2.

FIG. 4 is a diagram illustrating a configuration of the delay header 222 illustrated in FIG. 2. Referring to FIG. 4, the delay header 222 may include a first clock selecting circuit 410 and a second clock selecting circuit 420. The first clock selecting circuit 410 may receive the first clock signal FCLK and the first clock selecting signal FSEL to generate the first phase clock signal FCLKI. The first clock selecting circuit 410 may delay the first clock signal FCLK by an amount of the unit phase to generate a first delayed clock signal FCLKD. According to the first clock selecting signal FSEL, the first clock selecting circuit 410 may generate the first phase clock signal FCLKI based on one of the first clock signal FCLK and the first delayed clock signal FCLKD. When the first clock selecting signal FSEL is enabled to a first logic level, the first clock selecting circuit 410 may generate the first phase clock signal FCLKI based on the first clock signal FCLK. When the first clock selecting signal FSEL is disabled to a second logic level, the first clock selecting circuit 410 may generate the first phase clock signal FCLKI based on the first delayed clock signal FCLKD.

The second clock selecting circuit 420 may receive the second clock signal SCLK and the second clock selecting signal SSEL. The second clock selecting circuit 420 may generate an inverted clock signal ISCLK by inversely driving the second clock signal SCLK. The inverted clock signal ISCLK may have a phase lagging behind the first clock signal FCLK by an amount of half of the unit phase. The second clock selecting circuit 420 may generate a second delayed clock signal ISCLKD by delaying the inverted clock signal ISCLK by an amount of the unit phase. According to the second clock selecting signal SSEL, the second clock selecting circuit 420 may generate the second phase clock signal SCLKI based on one of the inverted clock signal ISCLK and the second delayed clock signal ISCLKD.

The first clock selecting circuit 410 may include a first inverter 411, a second inverter 412, a first pass gate 413, a second pass gate 414, and a third inverter 415. The first inverter 411 may inversely drive the first clock signal FCLK. The second inverter 412 may inversely drive an output of the first inverter 411 to generate the first delayed clock signal FCLKD. Because the first delayed dock signal FCLKD is delayed through the first inverter 411 and the second inverter 412, the first delayed clock signal FCLKD may be generated by delaying the first clock signal FCLK by an amount of a 2-gate delay. The amount of a 2-gate delay may correspond to the unit phase. The first pass gate 413 may output the first clock signal FCLK based on the first clock selecting signal FSEL. The first pass gate 413 may receive the first dock selecting signal FSEL and a complementary signal FSELB of the first dock selecting signal FSEL. When the first dock selecting signal FSEL is enabled to a high logic level, the first pass gate 413 may output the first clock signal FCLK. When the first dock selecting signal FSEL is disabled to a low logic level, the first pass gate 413 may block the output of the first clock signal FCLK. The second pass gate 414 may output the first delayed clock signal FCLKD based on the first dock selecting signal FSEL. The second pass gate 414 may receive the first clock selecting signal FSEL and the complementary signal FSELB of the first dock selecting signal FSEL. When the first dock selecting signal FSEL is disabled to a low logic level, the second pass gate 414 may output the first delayed clock signal FCLKD. When the first clock selecting signal FSEL is enabled to a high logic level, the second pass gate 414 may block the output of the first delayed clock signal FCLKD. The third inverter 415 may be coupled to each of the first pass gate 413 and the second pass gate 414. The third inverter 415 may inversely drive an output of each of the first pass gate 413 and the second pass gate 414 to generate the first phase clock signal FCLKI. Because the first pass gate 413 outputs the first clock signal FCLK when the first dock selecting signal FSEL is enabled, the third inverter 415 may inversely drive the first clock signal FCLK to generate the first phase clock signal FCLKI. Because the second pass gate 414 outputs the first delayed clock signal FCLKD when the first clock selecting signal FSEL is disabled, the third inverter 415 may inversely drive the first delayed clock signal FCLKD to generate the first phase clock signal FCLKI.

The first clock selecting circuit 410 may further include a dummy inverter 416 and a dummy pass gate 417. The dummy inverter 416 may receive the first delayed clock signal FCLKD output from the second inverter 412. An output node of the dummy inverter 416 may be floated. The dummy inverter 416 may be provided to match loads of the second clock selecting circuit 420, which will be described later, and the first clock selecting circuit 410. The dummy pass gate 417 may receive an output of each of the first pass gate 413 and the second pass gate 414 and may provide the third inverter 415 with the output of each of the first pass gate 413 and the second pass gate 414. The dummy pass gate 417 may receive the power voltage VDD and a ground voltage VSS to stay turned on. The dummy pass gate 417 may be provided to match the loads of the second clock selecting circuit 420, which will be described later, and the first clock selecting circuit 410.

The second clock selecting circuit 420 may include a first inverter 421, a second inverter 422, a third inverter 423, a first pass gate 424, a second pass gate 425, a fourth inverter 426, and a fifth inverter 427. The first inverter 421 may inversely drive the second clock signal SCLK to generate the inverted clock signal ISCLK. Because the inverted clock signal ISCLK is generated through the first inverter 421, the inverted clock signal ISCLK may be generated by delaying the second clock signal SCLK by an amount of a 1-gate delay. The inverted clock signal ISCLK may have phase difference corresponding to an amount of a 1-gate delay with respect to the first clock signal FCLK. The second inverter 422 may receive the inverted clock signal ISCLK output from the first inverter 421 and may inversely drive the inverted clock signal ISCLK. The third inverter 423 may inversely drive an output of the second inverter 422 to generate the second delayed clock signal ISCLKD. The first pass gate 424 may output the inverted clock signal ISCLK based on the second clock selecting signal SSEL. The first pass gate 424 may receive the second clock selecting signal SSEL and a complementary signal SSELB of the second clock selecting signal SSEL. When the second clock selecting signal SSEL is enabled to a high logic level, the first pass gate 424 may output the inverted clock signal ISCLK. When the second clock selecting signal SSEL is disabled to a low logic level, the first pass gate 424 may block the output of the inverted clock signal ISCLK. The second pass gate 425 may output the second delayed clock signal ISCLKD based on the second dock selecting signal SSEL. The second pass gate 425 may receive the second clock selecting signal SSEL and the complementary signal SSELB of the second clock selecting signal SSEL. When the second clock selecting signal SSEL is disabled to a low logic level, the second pass gate 425 may output the second delayed clock signal ISCLKD. When the second clock selecting signal SSEL is enabled to a high logic level, the second pass gate 425 may block the output of the second delayed clock signal ISCLKD. The fourth inverter 426 may be coupled to each of the first pass gate 424 and the second pass gate 425. The fourth inverter 426 may inversely drive an output of each of the first pass gate 424 and the second pass gate 425. The fifth inverter 427 may inversely drive an output of the fourth inverter 426 to generate the second phase clock signal SCLKI. Because the first pass gate 424 outputs the inverted clock signal ISCLK when the second clock selecting signal SSEL is enabled, the fourth inverter 426 and the fifth inverter 427 may inversely drive, sequentially, the inverted clock signal ISCLK to generate the second phase clock signal SCLKI. Because the second pass gate 425 outputs the second delayed clock signal ISCLKD when the second clock selecting signal SSEL is disabled, the fourth inverter 426 and the fifth inverter 427 may inversely drive, sequentially, the second delayed clock signal ISCLKD to generate the second phase clock signal SCLKI. In order to be matched with a load caused by the third inverter 423 and the fourth inverter 426 of the second clock selecting circuit 420, the first clock selecting circuit 410 may be provided with the dummy inverter 416 and the dummy pass gate 417.

When both the first clock selecting signal FSEL and the second dock selecting signal SSEL are enabled, the first clock selecting circuit 410 may generate the first phase clock signal FCLKI from the first clock signal FCLK, and the second clock selecting circuit 420 may generate the second phase clock signal SCLKI from the inverted clock signal ISCLK. Therefore, the first phase clock signal FCLKI may have a phase leading the second phase clock signal SCLKI by an amount of a 1-gate delay (i.e., by half of the unit phase). When the first clock selecting signal FSEL is disabled, the first clock selecting circuit 410 may generate the first phase clock signal FCLKI from the first delayed clock signal FCLKD, and the second clock selecting circuit 420 may generate the second phase clock signal SCLKI from the inverted clock signal ISCLK. Therefore, the first phase clock signal FCLKI may have a phase lagging behind the second phase clock signal SCLKI by an amount of a 1-gate delay (i.e., by half of the unit phase). When the second clock selecting signal SSEL is disabled, the first clock selecting circuit 410 may generate the first phase clock signal FCLKI from the first delayed clock signal FCLKD, and the second clock selecting circuit 420 may generate the second phase clock signal SCLKI from the second delayed clock signal ISCLKD. Therefore, the first phase clock signal FCLKI may again have the phase leading the second phase clock signal SCLKI by an amount of a 1-gate delay (i.e., by half of the unit phase). The delay header 222 may generate the first phase clock signal FCLKI and the second phase clock signal SCLKI having the phase difference corresponding to half of the unit phase thereby increasing a resolution of the phase mixing circuit 230.

Figure 5:
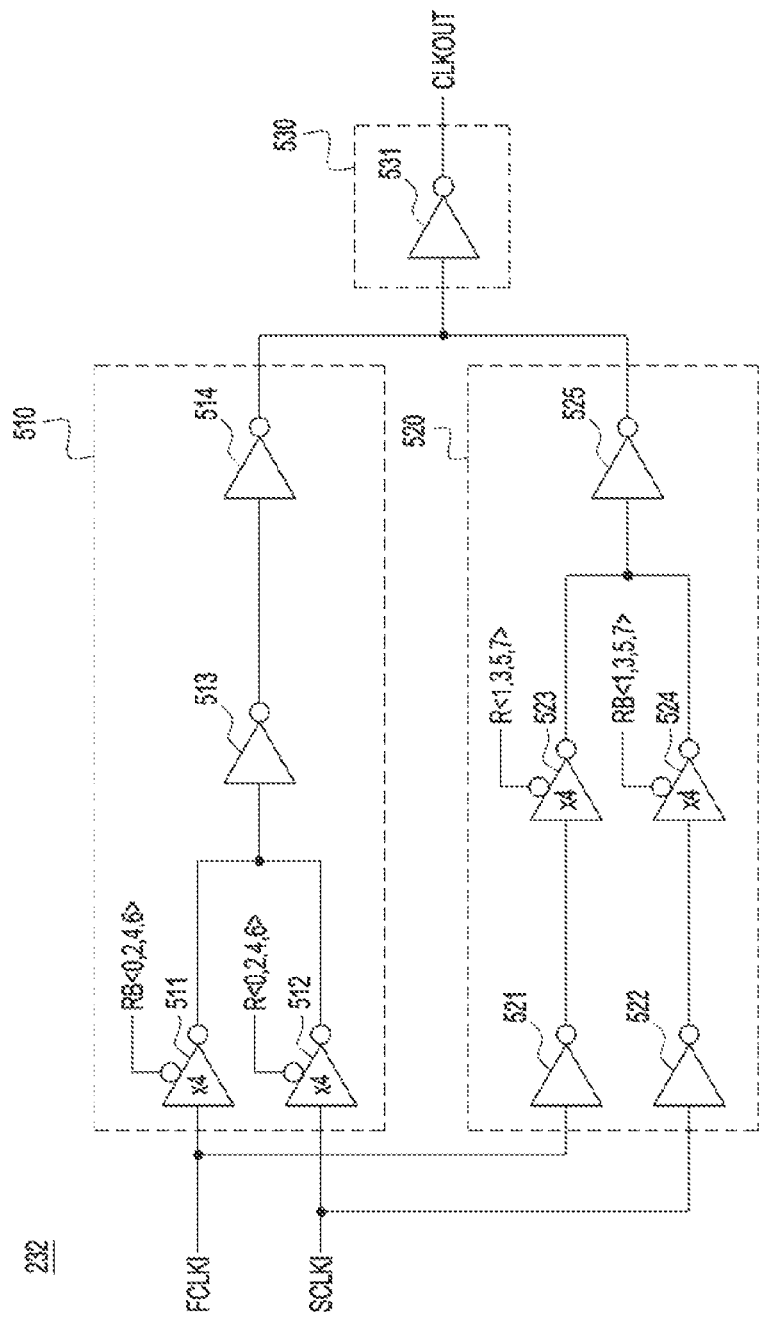
FIG. 5 as a diagram illustrating a configuration of a phase mixer illustrated in FIG. 2.

FIG. 5 is a diagram illustrating a configuration of the phase mixer 232 illustrated in FIG. 2. The phase mixer 232 may include a first mixer 510, a second mixer 520, and an output mixer 530. The first mixer 510 may receive the first phase clock signal FCLKI and the second phase clock signal SCLKI. The first mixer 510 may mix the phases of the first phase clock signal FCLKI and the second phase clock signal SCLKI based on the weight R<0:7>, The first mixer 510 may mix the phases of the first phase clock signal FCLKI and the second phase clock signal SCLKI based on partial bits of the weight R<0:7>. For example, the first mixer 510 may mix the phases of the first phase clock signal FCLKI and the second phase clock signal SCLKI based on odd bits (i.e., first, third, fifth, and seventh bits R<0,2,4,6>) of the weight R<0:7>, The second mixer 520 may receive the first phase clock signal FCLKI and the second phase clock signal SCLKI. The second mixer 520 may inversely drive the first phase clock signal FCLKI and the second phase clock signal SCLKI. The second mixer 520 may mix the phases of the inversely driven first phase clock signal FCLKI and the inversely driven second phase clock signal SCLKI based on the weight R<0:7>. The second mixer 520 may mix the phases of the inversely driven first phase clock signal FCLKI and the inversely driven second phase clock signal SCLKI based on partial bits of the weight R<0:7>. For example, the second mixer 520 may mix the phases of the inversely driven first phase clock signal FCLKI and the inversely driven second phase dock signal SCLKI based on even bits (i.e., second, fourth, sixth, and eighth bits R<1,3, 5,7>) of the weight R<0:7>. The output mixer 530 may receive outputs of the first mixer 510 and the second mixer 520. The output mixer 530 may mix the phases of the outputs of the first mixer 510 and the second mixer 520 to generate the output clock signal CLKOUT. The output mixer 530 may mix, one to one, the phases of the outputs of the first mixer 510 and the second mixer 520 to generate the output clock signal CLKOUT.

The first mixer 510 may include a first mixing driver 511, a second mixing driver 512, a first inverter 513, and a second inverter 514. Each of the first mixing driver 511 and the second mixing driver 512 may include a plurality of inverters configured to individual bits of the weight R<0:7>. When the weight R<0:7> has eight bits, each of the first mixing driver 511 and the second mixing driver 512 may include four inverters configured to respectively receive odd bits R<0,2,4,6> of the weight R<0:7>. The first mixing driver 511 may receive inverted signals RB<0,2,4,6> of the odd bits R<0,2,4,6>. The first mixing driver 511 may adjust its drivability of inversely driving the first phase clock signal FCLKI. The second mixing driver 512 may receive the odd bits R<0,2,4,6>. The second mixing driver 512 may adjust its drivability of inversely driving the second phase clock signal SCLKI. As the value of the odd bits R<0,2,4,6> increases, the drivability of the first mixing driver 511 may increase, and the drivability of the second mixing driver 512 may decrease. As the value of the odd bits R<0,2,4,6> decreases, the drivability of the first mixing driver 511 may decrease, and the drivability of the second mixing driver 512 may increase. The first inverter 513 may receive outputs of the first mixing driver 511 and the second mixing driver 512. The first inverter 513 may inversely drive the outputs of the first mixing driver 511 and the second mixing driver 512. The second inverter 514 may inversely drive an output of the first inverter 513. The first inverter 513 and the second inverter 514 may mix, one to one, phases of the outputs of the first mixing driver 511 and the second mixing driver 512.

The second mixer 520 may include a third inverter 521, a fourth inverter 522, a third mixing driver 523, a fourth mixing driver 524, and a fifth inverter 525. The third inverter 521 may inversely drive the first phase clock signal FCLKI. The fourth inverter 522 may inversely drive the second phase clock signal SCLKI. Each of the third mixing driver 523 and the fourth mixing driver 524 may include a plurality of inverters configured to individual bits of the weight R<0:7>, When the weight R<0:7> has eight bits, each of the third mixing driver 523 and the fourth mixing driver 524 may include four inverters configured to respectively receive even bits R<1,3,5,7> of the weight R<0:7>. The third mixing driver 523 may receive the even bits R<1,3,5,7>. The third mixing driver 523 may adjust its drivability of inversely driving the inverted first phase clock signal FCLKI. The fourth mixing driver 524 may receive inverted signals RB<1,3,5,7> of the even bits R<1,3,5,7>. The fourth mixing driver 524 may adjust its drivability of inversely driving the inverted second phase clock signal SCLKI. As the value of the even bits R<1,3,5,7> decreases, the drivability of the third mixing driver 523 may increase, and the drivability of the fourth mixing driver 524 may decrease. As the value of the even bits R<1,3,5,7> increases, the drivability of the third mixing driver 523 may decrease, and the drivability of the fourth mixing driver 524 may increase. The fifth inverter 525 may receive outputs of the third mixing driver 523 and the fourth mixing driver 524. The fifth inverter 525 may inversely drive the outputs of the third mixing driver 523 and the fourth mixing driver 524. The fifth inverter 525 may mix, one to one, phases of the outputs of the third mixing driver 523 and the fourth mixing driver 524.

The output mixer 530 may include a sixth inverter 531. The sixth inverter 531 may receive outputs of the second inverter 514 and the fifth inverter 525. The sixth inverter 531 may mix phases of the outputs of the second inverter 514 and the fifth inverter 525 to generate the output clock signal CLKOUT. The sixth inverter 531 may mix, one to one, the phases of the outputs of the second inverter 514 and the fifth inverter 525 to generate the output clock signal CLKOUT.

The phase mixer 232 may generate the output clock signal CLKOUT having the phase closer to the phase of the first phase clock signal FCLKI as a number of bits having a first logic level becomes greater within the weight R<0:7>. The phase mixer 232 may generate the output clock signal CLKOUT having the phase closer to the phase of the second phase clock signal SCLKI as a number of bits having a second logic level becomes greater within the weight R<0:7>. Because the phase difference between the first phase clock signal FCLKI and the second phase clock signal SCLKI remains at half of the unit phase, the phase mixer 232 may change stepwise the phase of the output clock signal CLKOUT by an amount of one-eighth of half of the unit phase based on the weight R<0:7>.

Figure 6:
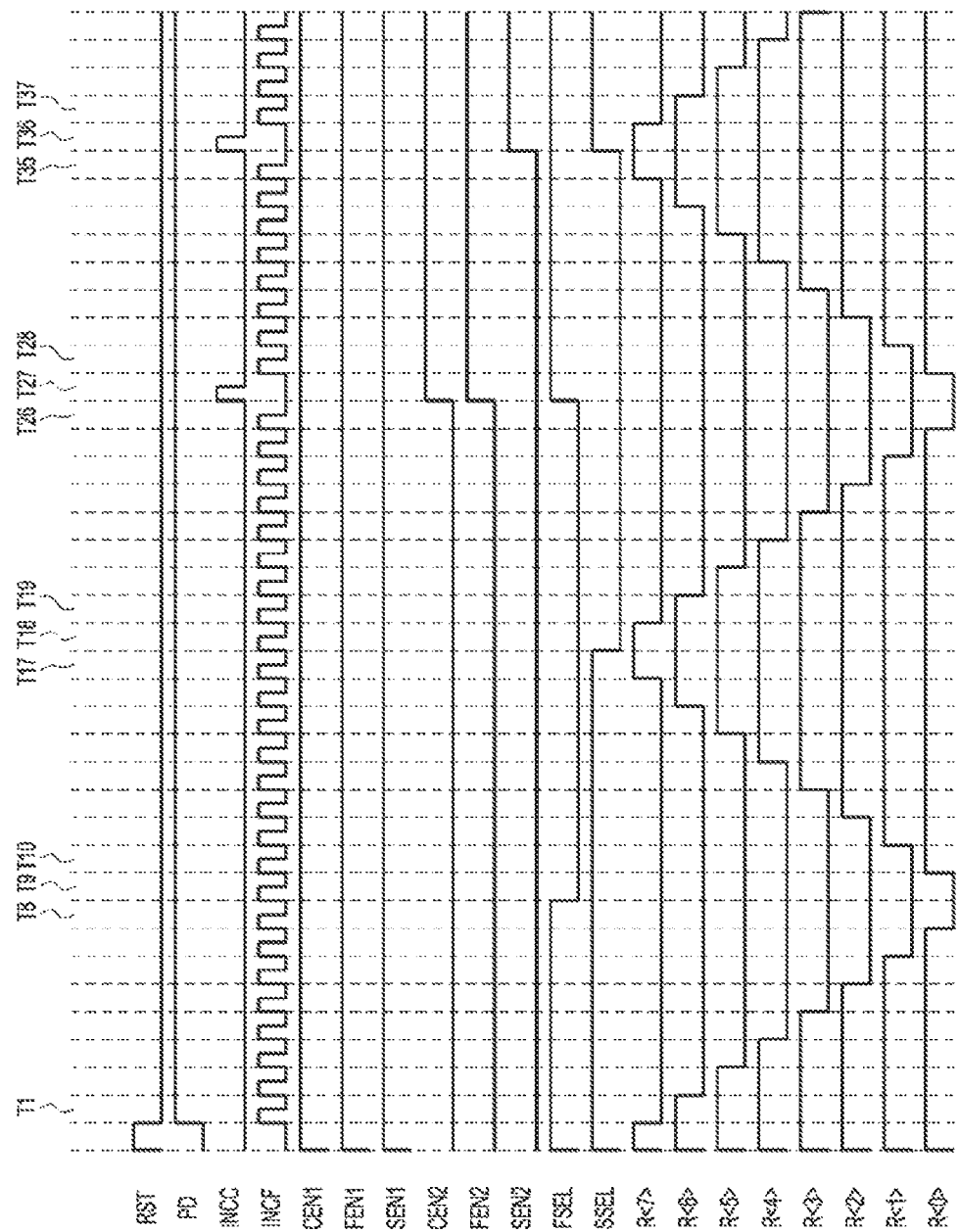
FIG. 6 is a diagram illustrating an operation of a delay locked loop circuit and a delay circuit in accordance with an embodiment.

FIG. 6 is a diagram illustrating an operation of the delay locked loop circuit 120 and the delay circuit 200 in accordance with an embodiment. Hereinafter, described with reference to FIGS. 1 to 6 will be the operation of the delay locked loop circuit 120 and the delay circuit 200 in accordance with an embodiment. The delay locked loop circuit 120 may perform a fine delay locking operation when completing a coarse delay locking operation. It is assumed that only the first enable signal EN1 becomes enabled as the coarse delay locking operation is performed, and the reference clock signal CLKR has the phase leading the feedback clock signal FBCLK. Referring to FIG. 6, an interval between two adjacent broken vertical lines may correspond to an update period of the delay locked loop circuit 120. When the delay locked loop circuit 120 starts the fine delay locking operation the reset signal RST is enabled and the first clock selecting signal FSEL and the second clock selecting signal SSEL are initialized to a high logic level based on the reset signal RST, and the weight R<0:7> may have its maximum value. The delay header 222 may output the first phase clock signal FCLKI and the second phase clock signal SCLKI having phases respectively corresponding to the first clock signal FCLK and the inverted clock signal ISCLK. First to eighth bits of the weight R<0:7> may have a high logic level. The phase mixer 232 may generate the output clock signal CLKOUT having the phase close to the phase of the first phase clock signal FCLKI. In a first update period T1, the phase detector 123 may compare the phases of the reference clock signal CLKR and the feedback clock signal FBCLK to generate the phase detection signal PD having a high logic level. The delay control circuit 124 may generate the fine increase signal INCF based on the phase detection signal PD. The fine shift register 231 may decrease the logic value of the weight R<0:7>, and the eighth bit R<7> of the weight R<0:7> may have a low logic level. When the phase detection signal PD remains at a high logic level, the logic value of the weight R<0:7> may sequentially decrease, and the phase mixer 232 may generate the output clock signal CLKOUT having the phase close to the phase of the second phase clock signal SCLKI.

In an eighth update period T8, the weight R<0:7> may have its minimum value by the fine shift register 231 and the phase mixer 232 may generate the output clock signal CLKOUT having the phase corresponding to the phase of the second phase clock signal SCLKI. Therefore, the output clock signal CLKOUT may be further delayed by an amount of half (i.e., an amount of a 1-gate delay) of the unit phase with respect to the phase thereof set through the coarse delay locking operation. In a ninth update period T9, the weight R<0:7> may have its minimum value and thus the header controller 221 may disable the first clock selecting signal FSEL to a low logic level. The delay header 222 may output the first delayed clock signal FCLKD and the inverted clock signal ISCLK respectively as the first phase clock signal FCLKI and the second phase clock signal SCLKI. In a tenth update period T10, when the fine increase signal INCF is generated again, the fine shift register 231 may increase again the logic value of the weight R<0:7> and the first bit R<0> of the weight R<0:7> may have a high logic level. When the phase detection signal PD remains at a high logic level, the logic value of the weight R<0:7> may sequentially increase and the phase mixer 232 may generate the output clock signal CLKOUT having the phase close to the phase of the first phase clock signal FCLKI.

In a seventeenth update period T17, the weight R<0:7> may have its maximum value by the fine shift register 231 and the phase mixer 232 may generate the output clock signal CLKOUT having the phase corresponding to the phase of the first phase clock signal FCLKI. Therefore, the output clock signal CLKOUT may be further delayed by the unit phase (i.e., an amount of a 2-gate delay) with respect to the phase thereof set through the coarse delay locking operation. In an eighteenth update period T18, the weight R<0:7> may have its maximum value and thus the header controller 221 may disable the second clock selecting signal SSEL to a low logic level. The delay header 222 may output the first delayed clock signal FCLKD and the second delayed clock signal ISCLKD respectively as the first phase clock signal FCLKI and the second phase clock signal SCLKI. In a nineteenth period T19, when the fine increase signal INCF is generated again, the fine shift register 231 may decrease again the logic value of the weight R<0:7> and the eighth bit R<7> of the weight R<0:7> may have a low logic level. When the phase detection signal PD remains at a high logic level, the logic value of the weight R<0:7> may sequentially decrease and the phase mixer 232 may generate the output clock signal CLKOUT having the phase close to the phase of the second phase clock signal SCLKI.

In a twenty-sixth update period T26, the weight R<0:7> may have its minimum value by the fine shift register 231 and the phase mixer 232 may generate the output clock signal CLKOUT having the phase corresponding to the phase of the second phase clock signal SCLKI. Therefore, the output clock signal CLKOUT may be further delayed by an amount of one and a half of the unit phase (i.e., an amount of a 3-gate delay) with respect to the phase thereof set through the coarse delay locking operation. In a twenty-seventh update period T27, the weight R<0:7> may have its minimum value and thus the header controller 221 may enable the first clock selecting signal FSEL to a high logic level. The delay control circuit 124 may detect the transition of the first clock selecting signal FSEL from a low logic level to a high logic level to generate the coarse increase signal INCC. The coarse shift register 211 may enable the second cell enable signal CEN2 and the second up-enable signal FEN2 of the second enable signal EN2. When the second cell enable signal CEN2 and the second up-enable signal FEN2 are enabled, the coarse delay line 212 may generate the second clock signal SCLK, which is the reference clock signal CLKR delayed by an amount of a 5-gate delay, and the first clock signal FCLK, which is the reference clock signal CLKR delayed by an amount of a 9-gate delay. The delay header 222 may output the first clock signal FCLK and the second delayed clock signal ISCLKD respectively as the first phase clock signal FCLKI and the second phase clock signal SCLKI. The first clock signal FCLK may have a phase lagging behind the second clock signal SCLK by an amount of a 4-gate delay. The second delayed clock signal ISCLKD may have a phase lagging behind the first clock signal FCLK by an amount of a 3-gate delay. Therefore, the phase difference between the first phase clock signal FCLKI and the second phase clock signal SCLKI may remain at half of the unit phase (i.e., an amount of a 1-gate delay). In a twenty-eighth update period T28, when the fine increase signal INCF is generated again, the fine shift register 231 may increase again the logic value of the weight R<0:7> and the first bit R<0> of the weight R<0:7> may have a high logic level. When the phase detection signal PD remains at a high logic level, the logic value of the weight R<0:7> may sequentially increase and the phase mixer 232 may generate the output clock signal CLKOUT having the phase close to the phase of the first phase clock signal FCLKI.

In a thirty-fifth update period T35, the weight R<0:7> may have its maximum value by the fine shift register 231 and the phase mixer 232 may generate the output clock signal CLKOUT having the phase corresponding to the phase of the first phase clock signal FCLKI. Therefore, the output clock signal CLKOUT may be further delayed by an amount of double the unit phase (i.e., an amount of a 4-gate delay) with respect to the phase thereof set through the coarse delay locking operation. In a thirty-sixth update period T36, the weight R<0:7> may have its maximum value and thus the header controller 221 may enable the second clock selecting signal SSEL to a high logic level. The delay control circuit 124 may detect the transition of the second clock selecting signal SSEL from a low logic level to a high logic level to enable the second down-enable signal SEN2 of the second enable signal EN2. When all of the second cell enable signal CEN2, the second up-enable signal FEN2, and the second down-enable signal SEN2 are enabled, the coarse delay line 212 may generate the first clock signal FCLK and the second clock signal SCLK delayed by a 9-gate delay. The delay header 222 may output the first clock signal FCLK and the inverted clock signal ISCLK respectively as the first phase clock signal FCLKI and the second phase clock signal SCLKI. Therefore, the phase difference between the first phase clock signal FCLKI and the second phase clock signal SCLKI may remain at half of the unit phase (i.e., an amount of a 1-gate delay). In a thirty-seventh update period T37, when the fine increase signal INCF is generated again, the fine shift register 231 may decrease again the logic value of the weight R<0:7> and the eighth bit R<7> of the weight R<0:7> may have a low logic level. When the phase detection signal PD remains at a high logic level, the logic value of the weight R<0:7> may sequentially decrease and the phase mixer 232 may generate the output clock signal CLKOUT having the phase close to the phase of the second phase clock signal SCLKI.

After that, the above-described operation is repeatedly performed and the phase of the output clock signal CLKOUT may be seamlessly delayed stepwise. When the feedback clock signal FBCLK has the phase leading the reference clock signal CLKR as the output clock signal CLKOUT is delayed, the phase detection signal PD may come to have a low logic level. The delay control circuit 124 may complete the fine delay locking operation and might not generate anymore the fine increase signal INCF and the fine decrease signal DECF.

When the unit delay time of the coarse delay line 212 decreases, an amount of time to complete the coarse delay locking operation may increase. When the unit delay time of the coarse delay line 212 increases, it may be hard to precisely perform the coarse delay locking operation. Therefore, it may be important to set the unit delay time of the coarse delay line 212 properly. According to an embodiment, the unit delay time of the coarse delay line 212 may be set to an amount of a 4-gate delay. When utilizing a general header circuit, the phase difference between the first phase clock signal FCLKI and the second phase clock signal SCLKI, which are provided to the phase mixing circuit 230, may be an amount of a 2-gate delay corresponding to half of the unit delay time of the coarse delay line 212. At this time, when the phase mixing operation is performed with the weight R<0:7> configured by 8 bits according to an embodiment, the phase of the output clock signal CLKOUT may change stepwise by an amount of one-eighth of a 2-gate delay during the fine delay locking operation. In order to increase the resolution of the phase mixer, a number of bits should increase within the weight and a number of inverters should increase for configuring the mixing driver. However, when utilizing the header circuit 220 according to an embodiment, the phase difference between the first phase clock signal FCLKI and the second phase clock signal SCLKI, which are provided to the phase mixing circuit 230, may be maintained to an amount of a 1-gate delay. Therefore, even when the phase mixing operation is performed with the weight R<0:7> configured by 8 bits, the phase of the output clock signal CLKOUT may change stepwise by an amount of one-eighth of a 1-gate delay during the fine delay locking operation. Accordingly, it may be possible to perform more precisely a delay locking operation. Further, the header circuit 220 and the phase mixing circuit 230 may operate according to the seamless boundary switching scheme in order to mix the phase of the output clock signal CLKOUT. That is, the weight R<0:7> may increase to its maximum value and decrease to its minimum value, repeatedly. Whenever the weight R<0:7> reaches its maximum value or its minimum value, the header circuit 220 may change a phase clock signal having a leading phase between the first phase clock signal FCLKI and the second phase clock signal SCLKI. Therefore, even when the delay time of the coarse delay line changes due to the logic level change of the first clock selecting signal FSEL and the second clock selecting signal SSEL during the fine delay locking operation, there might not occur jitter and the linearity of the phase mixing operation may be improved.

Figure 7:
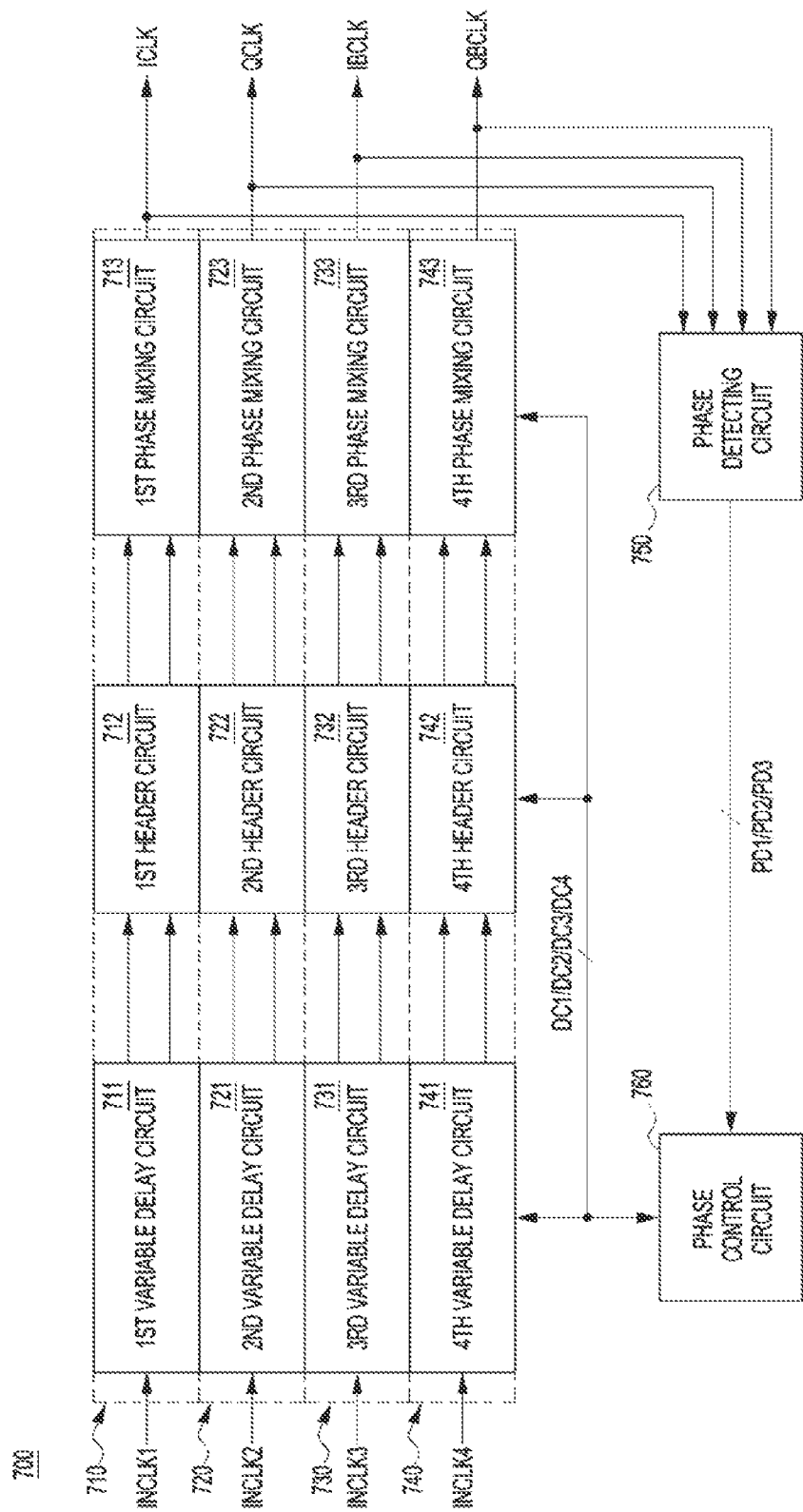
FIG. 7 is a diagram illustrating a configuration of a dock generating circuit in accordance with an embodiment.

FIG. 7 is a diagram illustrating a configuration of a clock generating circuit 700 in accordance with an embodiment. The clock generating circuit 700 may be applied as a circuit of various types, such as a multi-phase clock generating circuit, a duty correction circuit, and so forth. Referring to FIG. 7, the clock generating circuit 700 may receive a first input clock signal INCLK1, a second input clock signal INCLK2, a third input clock signal INCLK3, and a fourth input clock signal INCLK4 to generate a first output clock signal ICLK, a second output clock signal QCLK, a third output clock signal IBCLK, and a fourth output clock signal QBCLK. The first to fourth input clock signals INCLK1, INCLK2, INCLK3, and INCLK4 may have sequentially a phase difference of 90°. Phases of the first to fourth output clock signals ICLK, QCLK, IBCLK, and QBCLK may correspond respectively to the phases of the first to fourth input clock signals INCLK1, INCLK2, INCLK3, and INCLK4. The clock generating circuit 700 may keep the phase difference of 90° and the duty ratio of 50:50 of the first to fourth output clock signals ICLK, QCLK, IBCLK, and QBCLK, by detecting the phases of the first to fourth output clock signals ICLK, QCLK, IBCLK, and QBCLK and adjusting delay times by which the first to fourth input clock signals INCLK1, INCLK2, INCLK3, and INCLK4 are delayed.

The clock generating circuit 700 may include a first clock path 710, a second clock path 720, a third clock path 730, a fourth clock path 740, a phase detecting circuit 750, and a phase control circuit 760. The first clock path 710 may receive the first input clock signal INCLK1. The first clock path 710 may variably delay the first input clock signal INCLK1 based on a first delay control signal DC1 to generate the first output clock signal ICLK. The second clock path 720 may receive the second input clock signal INCLK2. The second clock path 720 may variably delay the second input clock signal INCLK2 based on a second delay control signal DC2 to generate the second output clock signal QCLK. The third clock path 730 may receive the third input clock signal INCLK3. The third clock path 730 may variably delay the third input clock signal INCLK3 based on a third delay control signal DC3 to generate the third output clock signal IBCLK. The fourth clock path 740 may receive the fourth input clock signal INCLK4. The fourth clock path 740 may variably delay the fourth input clock signal INCLK4 based on a fourth delay control signal DC4 to generate the fourth output clock signal QBCLK.

The phase detecting circuit 750 may receive the first to fourth output clock signals ICLK, QCLK, IBCLK, and QBCLK. The phase detecting circuit 750 may compare the phases of the first to fourth output clock signals ICLK, QCLK, IBCLK, and QBCLK to generate phase detection signals. In an embodiment, with respect to the first output clock signal ICLK, the phase detecting circuit 750 may compare the phase of the first output clock signal ICLK with each phase of the second to fourth output clock signals QCLK, IBCLK, and QBCLK to generate a first phase detection signal PD1, a second phase detection signal PD2, and a third phase detection signal PD3. In an embodiment, the phase detecting circuit 750 may compare the phases between two or more output clock signals having neighbouring phases among the first to fourth output clock signals ICLK, QCLK, IBCLK, and QBCLK to generate the first to third phase detection signals PD1, PD2, and PD3. For example, the phase detecting circuit 750 may compare the phases between the first output clock signal ICLK and the second output clock signal QCLK to generate the first phase detection signal PD1, may compare the phases between the second output clock signal QCLK and the third output clock signal IBCLK to generate the second phase detection signal PD2, and may compare the phases between the third output clock signal IBCLK and the fourth output clock signal QBCLK to generate the third phase detection signal PD3. This disclosure does not limit the configuration and the operation of the phase detecting circuit 750 to those described above, and any known phase detecting circuit configured to detect the phases of four clock signals may be applied as the phase detecting circuit 750.

Based on the first to third phase detection signals PD1, PD2, and PD3, the phase control circuit 760 may generate the first delay control signal DC1, the second delay control signal DC2, the third delay control signal DC3, and the fourth delay control signal DC4. The phase control circuit 760 may generate the first to fourth delay control signals DC1, DC2, DC3, and DC4 having default values. Based on the first to third phase detection signals PD1, PD2, and PD3, the phase control circuit 760 may change and/or update the values of the second to fourth delay control signals DC2, DC3, and DC4. Based on the first to fourth delay control signals DC1, DC2, DC3, and DC4, the first to fourth dock paths 710, 720, 730, and 740 may change the time amounts that the first to fourth input clock signals INCLK1, INCLK2, INCLK3, and INCLK4 are delayed.

The first dock path 710 may include a first variable delay circuit 711, a first header circuit 712, and a first phase mixing circuit 713. The first variable delay circuit 711 may be a coarse delay circuit. The first header circuit 712 and the first phase mixing circuit 713 may configure a fine delay circuit. The coarse delay circuit 210, the header circuit 220, and the phase mixing circuit 230 of the delay circuit 200 illustrated in FIG. 2 may be applied respectively as the first variable delay circuit 711, the first header circuit 712, and the first phase mixing circuit 713. The second clock path 720 may include a second variable delay circuit 721, a second header circuit 722, and a second phase mixing circuit 723. The second variable delay circuit 721 may be a coarse delay circuit. The second header circuit 722 and the second phase mixing circuit 723 may configure a fine delay circuit. The coarse delay circuit 210, the header circuit 220, and the phase mixing circuit 230 of the delay circuit 200 illustrated in FIG. 2 may be applied respectively as the second variable delay circuit 721, the second header circuit 722, and the second phase mixing circuit 723. The third clock path 730 may include a third variable delay circuit 731, a third header circuit 732 and a third phase mixing circuit 733. The third variable delay circuit 731 may be a coarse delay circuit. The third header circuit 732 and the third phase mixing circuit 733 may configure a fine delay circuit. The coarse delay circuit 210, the header circuit 220, and the phase mixing circuit 230 of the delay circuit 200 illustrated in FIG. 2 may be applied respectively as the third variable delay circuit 731, the third header circuit 732, and the third phase mixing circuit 733. The fourth clock path 740 may include a fourth variable delay circuit 741, a fourth header circuit 742, and a fourth phase mixing circuit 743. The fourth variable delay circuit 741 may be a coarse delay circuit. The fourth header circuit 742 and the fourth phase mixing circuit 743 may configure a fine delay circuit. The coarse delay circuit 210, the header circuit 220, and the phase mixing circuit 230 of the delay circuit 200 illustrated in FIG. 2 may be applied respectively as the fourth variable delay circuit 741, the fourth header circuit 742, and the fourth phase mixing circuit 743.

A limited number of possible embodiments have been described above. It will be understood by those skilled in the art that the embodiments described above serve only as examples and are not intended to be exhaustive. Accordingly, the delay circuit and a delay locked loop circuit using the same should not be limited based on the described embodiments. Rather, the delay circuit and a delay locked loop circuit using the same described herein should only be limited in light of the claims that follow when taken in conjunction with the above description and accompanying drawings.

Figure 8:
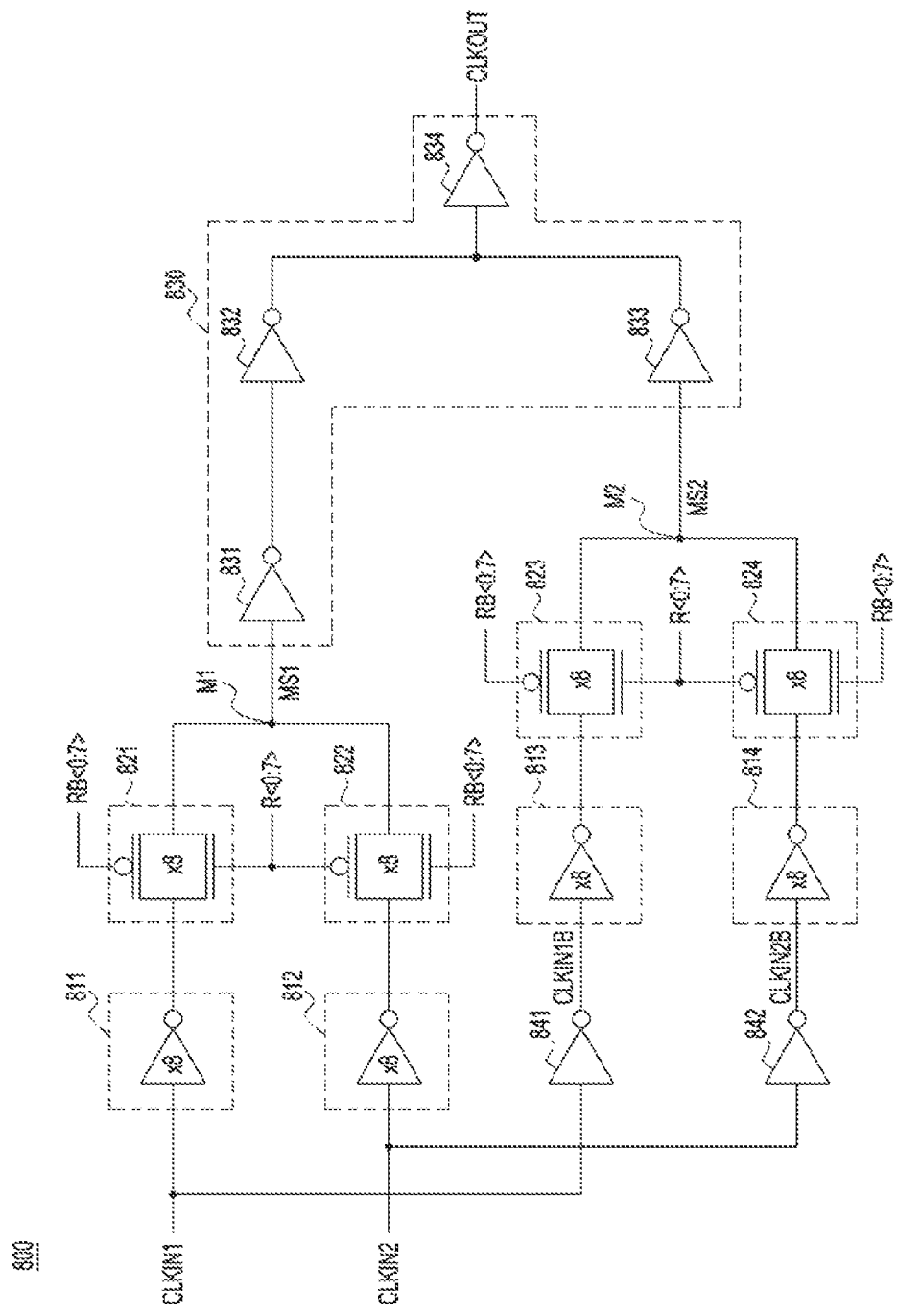
FIG. 8 is a diagram illustrating a configuration of a phase mixing circuit in accordance with an embodiment.

FIG. 8 is a diagram illustrating a configuration of a phase mixing circuit 800 in accordance with an embodiment. Referring to FIG. 8, the phase mixing circuit 800 may receive a first clock signal CLKIN1, a second clock signal CLKIN2, and a weight R<0:7>. The first and second clock signals CLKIN1 and CLKIN2 may have a preset phase difference between them. The phase mixing circuit 800 may generate an output clock signal CLKOUT by mixing the phases of the first and second clock signals CLKIN1 and CLKIN2 on the basis of the weight R<0:7>. The output clock signal CLKOUT may have a phase that changes between the first and second clock signals CLKIN1 and CLKIN2 according to the weight R<0:7>. The phase mixing circuit 800 may replace the phase mixer 232 illustrated in FIG. 5 so as to be applied as the phase mixer 232 illustrated in FIG. 2. When the phase mixing circuit 800 is applied as the phase mixer 232 illustrated in FIG. 2, the first clock signal CLKIN1 may correspond to the first clock signal FCLK, and the second clock signal CLKIN2 may correspond to the second clock signal SCLK. For an embodiment, the weight R<0:7> represents a weight signal.

The phase mixing circuit 800 may include a first driver 811, a second driver 812, a first selection circuit 821, and a second selection circuit 822. The first driver 811 may receive the first clock signal CLKIN1, and invert the first clock signal CLKIN1. The first driver 811 may include 2n inverters. Here, n may be a positive integer. The 2n inverters may each receive the first clock signal CLKIN1, and invert the first clock signal CLKIN1. The second driver 812 may receive the second clock signal CLKIN2, and invert the second clock signal CLKIN2. The second driver 812 may include 2n inverters. The 2n inverters may each receive the second clock signal CLKIN2, and invert the second clock signal CLKIN2. For example, n may be four, the first driver 811 may include eight (X8) inverters, and the second driver 812 may include eight (X8) inverters.

The first selection circuit 821 may be coupled to the first driver 811, and receive the weight R<0:7>. The first selection circuit 821 may couple the first driver 811 to a first mixing node M1 on the basis of the weight R<0:7>. The first selection circuit 821 may determine the number of inverters which are coupled to the first mixing node M1, among the 2n inverters of the first driver 811, based on the weight R<0:7>. The first selection circuit 821 may couple each of the 2n inverters of the first driver 811 to the first mixing node M1 on the basis of the weight R<0:7>. The weight R<0:7> may include first to $2n^{th}$ bits. The first selection circuit 821 may include an equal number of pass gates to the number of inverters included in the first driver 811. The first selection circuit 821 may include 2n pass gates. The 2n pass gates may be coupled one-to-one to the 2n inverters of the first driver 811. The first to $2n^{th}$ bits of the weight R<0:7> may be allocated to the 2n pass gates, respectively, one by one. The first selection circuit 821 may include eight (X8) pass gates, and the eight pass gates may be coupled to the eight inverters of the first driver 811, respectively. The eight pass gates may couple the eight inverters of the first driver 811 to the first mixing node M1 on the basis of the first to eighth bits R<0:7> of the weight, respectively.

As an example, a first pass gate may couple the first inverter of the first driver 811 to the first mixing node M1 on the basis of the first bit R<0> of the weight, and a second pass gate may couple the second inverter of the first driver 811 to the first mixing node M1 on the basis of the second bit R<1> of the weight. A third pass gate may couple the third inverter of the first driver 811 to the first mixing node M1 on the basis of the third bit R<2> of the weight, and a fourth pass gate may couple the fourth inverter of the first driver 811 to the first mixing node M1 on the basis of the fourth bit R<3> of the weight. A fifth pass gate may couple the fifth inverter of the first driver 811 to the first mixing node M1 on the basis of the fifth bit R<4> of the weight, and a sixth pass gate may couple the sixth inverter of the first driver 811 to the first mixing node M1 on the basis of the sixth bit R<5> of the weight. A seventh pass gate may couple the seventh inverter of the first driver 811 to the first mixing node M1 on the basis of the seventh bit R<6> of the weight, and an eighth pass gate may couple the eighth inverter of the first driver 811 to the first mixing node M1 on the basis of the eighth bit R<7> of the weight.

The second selection circuit 822 may be coupled to the second driver 812, and receive the weight R<0:7>, The second selection circuit 822 may couple the second driver 812 to the first mixing node M1 on the basis of an inverted signal RB<0:7> of the weight. The second selection circuit 822 may determine the number of inverters which are coupled to the first mixing node M1, among the 2n inverters of the second driver 812, on the basis of the inverted signal RB<0:7> of the weight. The second selection circuit 822 may couple each of the 2n inverters of the second driver 812 to the first mixing node M1 on the basis of the inverted signal RB<0:7> of the weight. The second selection circuit 822 may include an equal number of pass gates to the number of inverters included in the second driver 812. The second selection circuit 822 may include 2n pass gates. The 2n pass gates may be coupled one-to-one to the 2n inverters of the second driver 812. The first to $2n^{th}$ bits of the inverted signal RB<0:7> of the weight may be allocated to the 2n pass gates, respectively, one by one. The second selection circuit 822 may include eight (X8) pass gates, and the eight pass gates may be coupled to the eight inverters of the second driver 812, respectively. The eight pass gates may couple the eight inverters of the second driver 812 to the first mixing node M1 on the basis of first to eighth bits of the inverted signal RB<0:7> of the weight, respectively.

For example, a first pass gate may couple the first inverter of the second driver 812 to the first mixing node M1 on the basis of the first bit RB<0> of the inverted signal of the weight, and a second pass gate may couple the second inverter of the second driver 812 to the first mixing node M1 on the basis of the second bit RB<1> of the inverted signal of the weight. A third pass gate may couple the third inverter of the second driver 812 to the first mixing node M1 on the basis of the third bit RB<2> of the inverted signal of the weight, and a fourth pass gate may couple the fourth inverter of the second driver 812 to the first mixing node M1 on the basis of the fourth bit RB<3> of the inverted signal of the weight. A fifth pass gate may couple the fifth inverter of the second driver 812 to the first mixing node M1 on the basis of the fifth bit RB<4> of the inverted signal of the weight, and a sixth pass gate may couple the sixth inverter of the second driver 812 to the first mixing node M1 on the basis of the sixth bit RB<5> of the inverted signal of the weight.

A seventh pass gate may couple the seventh inverter of the second driver 812 to the first mixing node M1 on the basis of the seventh bit RB<6> of the inverted signal of the weight, and an eighth pass gate may couple the eighth inverter of the second driver 812 to the first mixing node M1 on the basis of the eighth bit RB<7> of the inverted signal of the weight. The phases of the signals outputted from the first and second selection circuits 821 and 822 may be mixed in the first mixing node M1. A first mixed signal MS1 may be outputted from the first mixing node M1.

The phase mixing circuit 800 may further include a third driver 813, a fourth driver 814, a third selection circuit 823, a fourth selection circuit 824, and an output circuit 830. The third driver 813 may receive a complementary signal CLKIN1B of the first clock signal, and invert the complementary signal CLKIN1B of the first clock signal. The third driver 813 may include 2n inverters. The 2n inverters may each receive the complementary signal CLKIN1B of the first dock signal, and invert the complementary signal CLKIN1B of the first clock signal. The fourth driver 814 may receive a complementary signal CLKIN2B of the second clock signal, and invert the complementary signal CLKIN2B of the second clock signal. The fourth driver 814 may include 2n inverters. The 2n inverters may each receive the complementary signal CLKIN2B of the second clock signal, and invert the complementary signal CLKIN2B of the second clock signal. The number of inverters included in each of the third and fourth drivers 813 and 814 may be equal to the number of inverters included in the first or second driver 811 or 812. For example, n may be four, the third driver 813 may include eight (X8) inverters, and the fourth driver 814 may include eight (X8) inverters.

The third selection circuit 823 may be coupled to the third driver 813, and receive the weight R<0:7>. The third selection circuit 823 may couple the third driver 813 to a second mixing node M2 on the basis of the weight R<0:7>. The third selection circuit 823 may determine the number of inverters which are coupled to the second mixing node M2, among the 2n inverters of the third driver 813, on the basis of the weight R<0:7>. The third selection circuit 823 may couple each of the 2n inverters of the third driver 813 to the second mixing node M2 on the basis of the weight R<0:7>. The third selection circuit 823 may include an equal number of pass gates to the number of inverters included in the third driver 813. The third selection circuit 823 may include 2n pass gates. The 2n pass gates may be coupled one-to-one to the 2n inverters of the third driver 813. The first to $2n^{th}$ bits of the weight R<0:7> may be allocated to the 2n pass gates, respectively, one by one. The third selection circuit 823 may include eight (X8) pass gates, and the eight pass gates may be coupled to the eight inverters of the third driver 813, respectively. The eight pass gates may couple the eight inverters of the third driver 813 to the second mixing node M2 on the basis of the first to eighth bits R<0:7> of the weight, respectively. The coupling relationships between the eight inverters of the third driver 813 and the eight pass gates of the third selection circuit 823, based on the first to eight bits R<0:7> of the weight, may be substantially the same as the coupling relationships between the eight inverters of the first driver 811 and the eight pass gates of the first selection circuit 821.

The fourth selection circuit 824 may be coupled to the fourth driver 814, and receive the weight R<0:7>. The fourth selection circuit 824 may couple the fourth driver 814 to the second mixing node M2 on the basis of the inverted signal RB<0:7> of the weight. The fourth selection circuit 824 may determine the number of inverters which are coupled to the second mixing node M2, among the 2n inverters of the fourth driver 814, on the basis of the inverted signal RB<0:7> of the weight. The fourth selection circuit 824 may couple each of the 2n inverters of the fourth driver 814 to the second mixing node M2 on the basis of the inverted signal RB<0:7> of the weight. The fourth selection circuit 824 may include an equal number of pass gates to the number of inverters included in the fourth driver 814. The fourth selection circuit 824 may include 2n pass gates. The 2n pass gates may be coupled one-to-one to the 2n inverters of the fourth driver 814. The first to $2n^{th}$ bits of the inverted signal RB<0:7> of the weight may be allocated to the 2n pass gates, respectively. The fourth selection circuit 824 may include eight (X8) pass gates, and the eight pass gates may be coupled to the eight inverters of the fourth driver 814, respectively. The eight pass gates may couple the eight inverters of the fourth driver 814 to the second mixing node M2 on the basis of the first to eighth bits RB<0:7> of the inverted signal of the weight, respectively. The coupling relationships between the eight inverters of the fourth driver 814 and the eight pass gates of the fourth selection circuit 824, based on the first to eight bits RB<0:7> of the inverted signal of the weight, may be substantially the same as the coupling relationships between the eight inverters of the second driver 812 and the eight pass gates of the second selection circuit 822. The phases of the signals outputted from the third and fourth selection circuits 823 and 824 may be mixed in the second mixing node M2. A second mixed signal MS2 may be outputted from the second mixing node M2.

The output circuit 830 may be coupled to the first and second mixing nodes M1 and M2, and receive the first mixed signal MS1 from the first mixing node M1 and the second mixed signal MS2 from the second mixing node M2. The output circuit 830 may generate the output clock signal CLKOUT by mixing the phases of the first and second mixed signals MS1 and MS2. For example, the output circuit 830 may generate the output clock signal CLKOUT by mixing the inverted signals of the first and second mixed signals MS1 and MS2 at a ratio of 1:1. The output circuit 830 may include a first inverter 831, a second inverter 832, a third inverter 833, and a fourth inverter 834. The first inverter 831 may be coupled to the first mixing node M1, and receive the first mixed signal MS1. The first inverter 831 may invert the first mixed signal MS1. The second inverter 832 may be coupled to the first inverter 831. The second inverter 832 may receive an output of the first inverter 831, and invert the output of the first inverter 831. The third inverter 833 may be coupled to the second mixing node M2, and receive the second mixed signal MS2. The third inverter 833 may invert the second mixed signal MS2. The fourth inverter 834 may be coupled to the second and third inverters 832 and 833, and receive outputs of the second and third inverters 832 and 833. The fourth inverter 834 may generate the output clock signal CLKOUT by mixing the phases of the outputs of the second and third inverters 832 and 833 at a ratio of 1:1.

The phase mixing circuit 800 may further include a fifth inverter 841 and a sixth inverter 842. The fifth inverter 841 may receive the first clock signal CLKIN1, and generate the complementary signal CLKIN1B of the first clock signal by inverting the first clock signal CLKIN1. The fifth inverter 841 may provide the complementary signal CLKIN1B of the first clock signal to the third driver 813. The sixth inverter 842 may receive the second clock signal CLKIN2, and generate a complementary signal CLKIN2B of the second clock signal by inverting the second clock signal CLKIN2.

The sixth inverter 842 may provide the complementary signal CLKIN2B of the second clock signal to the fourth driver 814.

Figure 9:
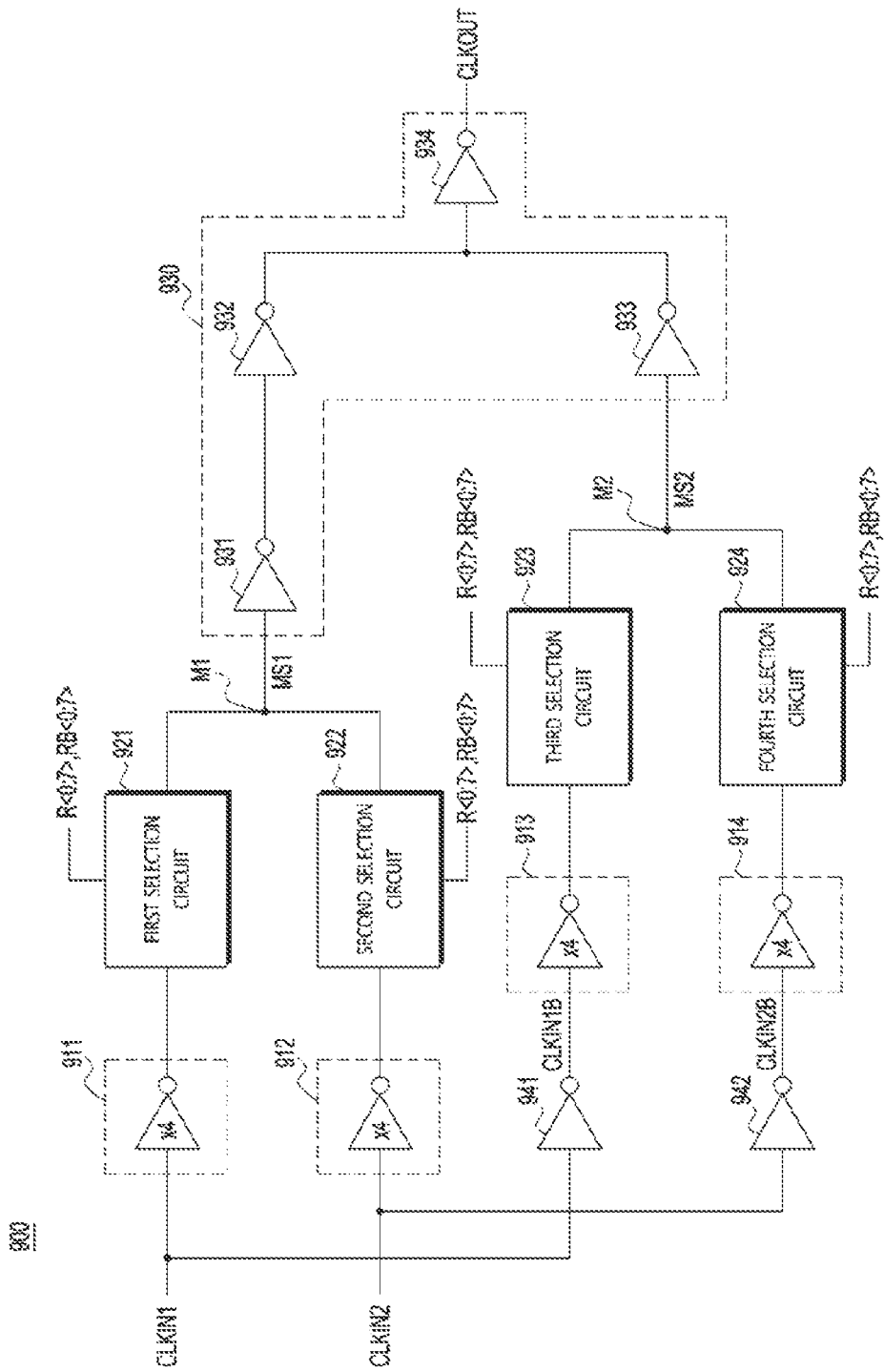
FIG. 9 is a diagram illustrating a configuration of a phase mixing circuit in accordance with an embodiment.

The phase mixer 232 illustrated in FIG. 5 may use the driver including a smaller number of inverters than the number of bits contained in the weight R<0:7>, thereby reducing power used for phase mixing. However, whenever the value of the weight R<0:7> is changed in a stepwise manner, the delay time at which the output clock signal CLKOUT is generated may be changed, which makes it impossible to secure step delay linearity. The step delay linearity may serve as a reference indicating whether the time at which the output cock signal is generated from the phase mixer or the phase mixing circuit linearly changes when the value of the weight is changed in a stepwise manner. In order to improve the step delay linearity, a driver including the same number of inverters as the number of bits contained in the weight R<0:7> may be used. In this case, however, the increase in the number of inverters may raise the load of the node, which makes it difficult to perform a high-speed operation. The phase mixing circuit 800 may use a driver including an equal number of inverters to the number of bits of the weight R<0:7>, in order to improve the step delay linearity. Furthermore, the phase mixing circuit 800 may limit the number of inverters, coupled to a node according to the value of the weight R<0:7>, through a selection circuit, thereby reducing the load of the node and making it possible to perform a high-speed operation, FIG. 9 is a diagram illustrating a configuration of a phase mixing circuit 900 in accordance with an embodiment. Referring to FIG. 9, the phase mixing circuit 900 may include a first driver 911, a second driver 912, a first selection circuit 921, and a second selection circuit 922. The first driver 911 may receive the first clock signal CLKIN1, and invert the first clock signal CLKIN1. The first driver 911 may include n inverters. Here, n may be a positive integer. The n inverters may each receive the first clock signal CLKIN1, and invert the first clock signal CLKIN1. The second driver 912 may receive the second clock signal CLKIN2, and invert the second clock signal CLKIN2. The second driver 912 may include n inverters. The n inverters may each receive the second clock signal CLKIN2, and invert the second clock signal CLKIN2. The first and second clock signals CLKIN1 and CLKIN2 may have a preset phase difference between them. For example, n may be four, the first driver 911 four (X4) inverters, and the second driver 912 may include four (X4) inverters.

The first selection circuit 921 may be coupled to the first driver 911, and receive the weight R<0:7>. The first selection circuit 921 may couple the first driver 911 to a first mixing node M1 on the basis of at least part of the weight R<0:7> and at least a part of the inverted signal RB<0:7> of the weight. The first selection circuit 921 may determine the number of inverters coupled to the first mixing node M1, among the n inverters of the first driver 911, on the basis of at least part of the weight R<0:7> and at least a part of the inverted signal RB<0:7> of the weight. The first selection circuit 921 may couple each of the n inverters of the first driver 911 to the first mixing node M1, on the basis of at least part of the weight R<0:7> and at least a part of the inverted signal RB<0:7> of the weight. The weight R<0:7> may include first to $2n^{th}$ bits. The first selection circuit 921 may include an equal number of pass gates to the number of bits contained in the weight R<0:7>. The first driver 911 may include a smaller number of inverters than the number of bits contained in the weight R<0:7>. For example, the first driver 911 may include a plurality of inverters corresponding to a half of the number of bits contained in the weight R<0:7>. The first selection circuit 921 may include 2n pass gates. The 2n pass gates may be coupled two-to-one to the n inverters of the first driver 911. At this time, n bits of the first to $2n^{th}$ bits of the weight R<0:7> and n bits of the first to $2n^{th}$ bits of the inverted signal RB<0:7> of the weight may be allocated to the 2n pass gates, respectively. In an embodiment, the n bits of the weight R<0:7> may be odd bits of the weight R<0:7>, and the n bits of the inverted signal RB<0:7> of the weight may be even bits of the inverted signal RB<0:7> of the weight. In an embodiment, the n bits of the weight R<0:7> may be lower bits of the weight R<0:7>, and the n bits of the inverted signal RB<0:7> of the weight may be upper bits of the inverted signal RB<0:7> of the weight.

The first selection circuit 921 may include eight (X8) pass gates, and the eight pass gates may be coupled to the four inverters of the first driver 911. The eight pass gates may couple the four inverters of the first driver 911 to the first mixing node M1 on the basis of four bits of the first to eighth bits R<0:7> of the weight and four bits of the first to eighth bits RB<0:7> of the inverted signal of the weight. For example, the first and second pass gates of the first selection circuit 921 may be coupled between the first inverter of the first driver 911 and the first mixing node M1. The third and fourth pass gates of the first selection circuit 921 may be coupled between the second inverter of the first driver 911 and the first mixing node M1. The fifth and sixth pass gates of the first selection circuit 921 may be coupled between the third inverter of the first driver 911 and the first mixing node M1. The seventh and eighth pass gates of the first selection circuit 921 may be coupled between the fourth inverter of the first driver 911 and the first mixing node M1.

The second selection circuit 922 may be coupled to the second driver 912, and receive the weight R<0:7>, The second selection circuit 922 may couple the second driver 912 to the first mixing node M1 on the basis of at least part of the weight R<0:7> and at least a part of the inverted signal RB<0:7> of the weight. The second selection circuit 922 may determine the number of inverters coupled to the first mixing node M1, among the n inverters of the second driver 912, on the basis of at least part of the weight R<0:7> and at least a part of the inverted signal RB<0:7> of the weight. The second selection circuit 922 may couple each of the n inverters of the second driver 912 to the first mixing node M1, on the basis of at least part of the weight R<0:7> and at least a part of the inverted signal RB<0:7> of the weight. The second selection circuit 922 may include an equal number of pass gates to the number of bits contained in the weight R<0:7>, The second driver 912 may include a smaller number of inverters than the number of bits contained in the weight R<0:7 For example, the second driver 912 may include a plurality of inverters corresponding to a half of the number of bits contained in the weight R<0:7>, The second selection circuit 922 may include 2n pass gates. The 2n pass gates may be coupled two-to-one to the n inverters of the second driver 912. At this time, n bits of the first to $2n^{th}$ bits of the weight R<0:7> and n bits of the first to $2n^{th}$ bits of the inverted signal RB<0:7> of the weight may be allocated to the 2n pass gates, respectively. In an embodiment, the n bits of the inverted signal RB<0:7> of the weight may be odd bits of the inverted signal RB<0:7> of the weight, and the n bits of the weight R<0:7> may be even bits of the weight R<0:7>. In an embodiment, the n bits of the inverted signal RB<0:7> of the weight may be lower bits of the inverted signal RB<0:7> of the weight, and the n bits of the weight R<0:7> may be upper bits of the weight R<0:7>.

The second selection circuit 922 may include eight (X8) pass gates, and the eight pass gates may be coupled to the four inverters of the second driver 912. The eight pass gates may couple the four inverters of the second driver 912 to the first mixing node M1 on the basis of four bits of the first to eighth bits R<0:7> of the weight and four bits of the first to eighth bits RB<0:7> of the inverted signal of the weight. For example, the first and second pass gates of the second selection circuit 922 may be coupled between the first inverter of the second driver 912 and the first mixing node M1. The third and fourth pass gates of the second selection circuit 922 may be coupled between the second inverter of the second driver 912 and the first mixing node M1. The fifth and sixth pass gates of the second selection circuit 922 may be coupled between the third inverter of the second driver 912 and the first mixing node M1. The seventh and eighth pass gates of the second selection circuit 922 may be coupled between the fourth inverter of the second driver 912 and the first mixing node M1. The phases of the signals outputted from the first and second selection circuits 921 and 922 may be mixed in the first mixing node M1. A first mixed signal MS1 may be outputted from the first mixing node M1.

The phase mixing circuit 900 may further include a third driver 913, a fourth driver 914, a third selection circuit 923, a fourth selection circuit 924, and an output circuit 930. The third driver 913 may receive a complementary signal CLKIN1B of the first clock signal, and invert the complementary signal CLKIN1B of the first clock signal. The third driver 913 may include n inverters. The n inverters may each receive the complementary signal CLKIN1B of the first dock signal, and invert the complementary signal CLKIN1B of the first clock signal. The fourth driver 914 may receive a complementary signal CLKIN2B of the second clock signal, and invert the complementary signal CLKIN2B of the second clock signal. The fourth driver 914 may include n inverters. The n inverters may each receive the complementary signal CLKIN2B of the second clock signal, and invert the complementary signal CLKIN2B of the second clock signal. The number of inverters included in each of the third and fourth drivers 913 and 914 may be equal to the number of inverters included in the first or second driver 911 or 912. For example, n may be four, the third driver 913 may include four (X4) inverters, and the fourth driver 914 may include four (X4) inverters.

The third selection circuit 923 may be coupled to the third driver 913, and receive the weight R<0:7>, The third selection circuit 923 may couple the third driver 913 to a second mixing node M2 on the basis of at least part of the weight R<0:7> and at least a part of the inverted signal RB<0:7> of the weight. The third selection circuit 923 may determine the number of inverters coupled to the second mixing node M2, among the n inverters of the third driver 913, on the basis of at least part of the weight R<0:7> and at least a part of the inverted signal RB<0:7> of the weight. The third selection circuit 923 may couple each of the n inverters of the third driver 913 to the second mixing node M2, on the basis of at least part of the weight R<0:7> and at least a part of the inverted signal RB<0:7> of the weight. The third selection circuit 923 may include an equal number of pass gates to the number of bits contained in the weight R<0:7>. The third selection circuit 923 may include 2n pass gates. The 2n pass gates may be coupled two-to-one to the n inverters of the third driver 913. At this time, n bits of the first to $2n^{th}$ bits of the weight R<0:7> and n bits of the first to $2n^{th}$ bits of the inverted signal RB<0:7> of the weight may be allocated to the 2n pass gates, respectively. In an embodiment, the n bits of the weight R<0:7> may be odd bits of the weight R<0:7>, and the n bits of the inverted signal RB<0:7> of the weight may be even bits of the inverted signal RB<0:7> of the weight. In an embodiment, then bits of the weight R<0:7> may be lower bits of the weight R<0:7>, and the n bits of the inverted signal RB<0:7> of the weight may be upper bits of the inverted signal RB<0:7> of the weight. The third selection circuit 923 may include eight (X8) pass gates, and the eight pass gates may be coupled to the four inverters of the third driver 913. The coupling relationship between the four inverters of the third driver 913 and the eight pass gates of the third selection circuit 923 may be substantially the same as the coupling relationship between the four inverters of the first driver 911 and the eight pass gates of the first selection circuit 921.

The fourth selection circuit 924 may be coupled to the fourth driver 914, and receive the weight R<0:7>. The fourth selection circuit 924 may couple the fourth driver 914 to the second mixing node M2 on the basis of at least part of the weight R<0:7> and at least a part of the inverted signal RB<0:7> of the weight. The fourth selection circuit 924 may determine the number of inverters coupled to the second mixing node M2, among the n inverters of the fourth driver 914, on the basis of at least part of the weight R<0:7> and at least a part of the inverted signal RB<0:7> of the weight. The fourth selection circuit 924 may couple each of the n inverters of the fourth driver 914 to the second mixing node M2, on the basis of at least part of the weight R<0:7> and at least a part of the inverted signal RB<0:7> of the weight. The fourth selection circuit 924 may include an equal number of pass gates to the number of bits contained in the weight R<0:7>. The fourth selection circuit 924 may include 2n pass gates. The 2n pass gates may be coupled two-to-one to the n inverters of the fourth driver 914. At this time, n bits of the first to $2n^{th}$ bits of the weight R<0:7> and n bits of the first to 2n bits of the inverted signal RB<0:7> of the weight may be allocated to the 2n pass gates, respectively. In an embodiment, the n bits of the inverted signal RB<0:7> of the weight may be odd bits of the inverted signal RB<0:7> of the weight, and the n bits of the weight R<0:7> may be even bits of the weight R<0:7>, In an embodiment, the n bits of the inverted signal RB<0:7> of the weight may be lower bits of the inverted signal RB<0:7> of the weight, and the n bits of the weight R<0:7> may be upper bits of the weight R<0:7>. The fourth selection circuit 924 may include eight (X8) pass gates, and the eight pass gates may be coupled to the four inverters of the fourth driver 914, respectively. The coupling relationship between the four inverters of the fourth driver 914 and the eight pass gates of the fourth selection circuit 924 may be substantially the same as the coupling relationship between the four inverters of the second driver 912 and the eight pass gates of the second selection circuit 922. The phases of the signals outputted from the third and fourth selection circuits 923 and 924 may be mixed in the second mixing node M2. A second mixed signal MS2 may be outputted from the second mixing node M2.

The output circuit 930 may be coupled to the first and second mixing nodes M1 and M2, and receive the first mixed signal MS1 from the first mixing node M1 and the second mixed signal MS2 from the second mixing node M2. The output circuit 930 may generate the output clock signal CLKOUT by mixing the phases of the first and second mixed signals MS1 and MS2. For example, the output circuit 930 may generate the output clock signal CLKOUT by mixing the inverted signals of the first and second mixed signals MS1 and MS2 at a ratio of 1:1. The output circuit 930 may include a first inverter 931, a second inverter 932, a third inverter 933, and a fourth inverter 934. The first inverter 931 may be coupled to the first mixing node M1, and receive the first mixed signal MS1. The first inverter 931 may invert the first mixed signal MS1. The second inverter 932 may be coupled to the first inverter 931. The second inverter 932 may receive an output of the first inverter 931, and invert the output of the first inverter 931. The third inverter 933 may be coupled to the second mixing node M2, and receive the second mixed signal MS2. The third inverter 933 may invert the second mixed signal MS2. The fourth inverter 934 may be coupled to the second and third inverters 932 and 933, and receive outputs of the second and third inverters 932 and 933. The fourth inverter 934 may generate the output clock signal CLKOUT by mixing the phases of the outputs of the second and third inverters 932 and 933 at a ratio of 1:1.

The phase mixing circuit 900 may further include a fifth inverter 941 and a sixth inverter 942. The fifth inverter 941 may receive the first clock signal CLKIN1, and generate the complementary signal CLKIN1B of the first clock signal by inverting the first clock signal CLKIN1. The fifth inverter 941 may provide the complementary signal CLKIN1B of the first clock signal to the third driver 913. The sixth inverter 942 may receive the second clock signal CLKIN2, and generate a complementary signal CLKIN2B of the second clock signal by inverting the second clock signal CLKIN2. The sixth inverter 942 may provide the complementary signal CLKIN2B of the second clock signal to the fourth driver 914. The first to fourth drivers 911 to 914 of the phase mixing circuit 900 may include a smaller number of inverters than the number of bits contained in the weight R<0:7>. Therefore, the phase mixing circuit 900 may reduce the load of the node, and reduce or minimize the power consumption for phase mixing.

Figure 10A:
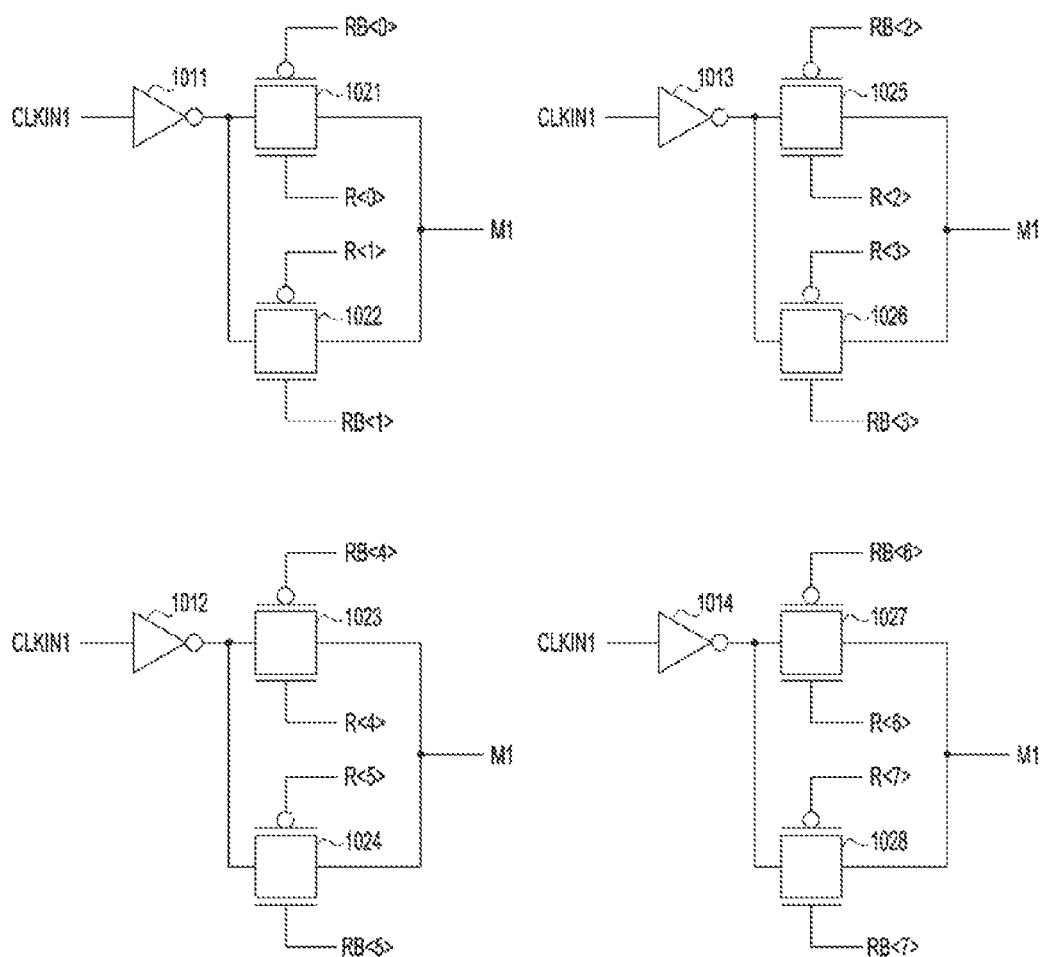
FIG. 10A is a diagram illustrating a coupling relationship between a first driver and a first selection circuit which are illustrated in FIG. 9.

FIG. 10A is a diagram illustrating a coupling relationship between the first driver 911 and the first selection circuit 921 which are illustrated in FIG. 9. The first driver 911 may include a first inverter 1011, a second inverter 1012, a third inverter 1013, and a fourth inverter 1014. The first to fourth inverters 1011 to 1014 may commonly receive the first clock signal CLKIN1, and invert the first clock signal CLKIN1. The first selection circuit 921 may include a first pass gate 1021, a second pass gate 1022, a third pass gate 1023, a fourth pass gate 1024, a fifth pass gate 1025, a sixth pass gate 1026, a seventh pass gate 1027, and an eighth pass gate 1028. The first and second pass gates 1021 and 1022 may be coupled between the first inverter 1011 and the first mixing node M1. The third and fourth pass gates 1023 and 1024 may be coupled between the second inverter 1012 and the first mixing node M1. The fifth and sixth pass gates 1025 and 1026 may be coupled between the third inverter 1013 and the first mixing node M1. The seventh and eighth pass gates 1027 and 1028 may be coupled between the fourth inverter 1014 and the first mixing node M1.

The first bit R<0> of the weight may be allocated to the first pass gate 1021, and the second bit RB<1> of the inverted signal of the weight may be allocated to the second pass gate 1022. The first pass gate 1021 may couple an output terminal of the first inverter 1011 to the first mixing node M1 on the basis of the first bit R<0> of the weight and the first bit RB<0> of the inverted signal of the weight. The first pass gate 1021 may be turned on when the first bit R<0> of the weight is at a high logic level. The second pass gate 1022 may couple the output terminal of the first inverter 1011 to the first mixing node M1 on the basis of the second bit RB<1> of the inverted signal of the weight and the second bit R<1> of the weight. The second pass gate 1022 may be turned on when the second bit RB<1> of the inverted signal of the weight is at a high logic level.

The fifth bit R<4> of the weight may be allocated to the third pass gate 1023, and the sixth bit RB<5> of the inverted signal of the weight may be allocated to the fourth pass gate 1024. The third pass gate 1023 may couple an output terminal of the second inverter 1012 to the first mixing node M1 on the basis of the fifth bit R<4> of the weight and the fifth bit RB<4> of the inverted signal of the weight. The third pass gate 1023 may be turned on when the fifth bit R<4> of the weight is at a high logic level. The fourth pass gate 1024 may couple the output terminal of the second inverter 1012 to the first mixing node M1 on the basis of the sixth bit RB<5> of the inverted signal of the weight and the sixth bit R<5> of the weight. The fourth pass gate 1024 may be turned on when the sixth bit RB<5> of the inverted signal of the weight is at a high logic level.

The third bit R<2> of the weight may be allocated to the fifth pass gate 1025, and the fourth bit RB<3> of the inverted signal of the weight may be allocated to the sixth pass gate 1026. The fifth pass gate 1025 may couple an output terminal of the third inverter 1013 to the first mixing node M1 on the basis of the third bit R<2> of the weight and the third bit RB<2> of the inverted signal of the weight. The fifth pass gate 1025 may be turned on when the third bit R<2> of the weight is at a high logic level. The sixth pass gate 1026 may couple the output terminal of the third inverter 1013 to the first mixing node M1 on the basis of the fourth bit RB<3> of the inverted signal of the weight and the fourth bit R<3> of the weight. The sixth pass gate 1026 may be turned on when the fourth bit RB<3> of the inverted signal of the weight is at a high logic level.

The seventh bit R<6> of the weight may be allocated to the seventh pass gate 1027, and the eighth bit RB<7> of the inverted signal of the weight may be allocated to the eighth pass gate 1028. The seventh pass gate 1027 may couple an output terminal of the fourth inverter 1014 to the first mixing node M1 on the basis of the seventh bit R<6> of the weight and the seventh bit RB<6> of the inverted signal of the weight. The seventh pass gate 1027 may be turned on when the seventh bit R<6> of the weight is at a high logic level. The eighth pass gate 1028 may couple the output terminal of the fourth inverter 1014 to the first mixing node M1 on the basis of the eighth bit RB<7> of the inverted signal of the weight and the eighth bit R<7> of the weight. The eighth pass gate 1028 may be turned on when the eighth bit RB<7> of the inverted signal of the weight is at a high logic level.

The coupling relationships between the inverters of the third driver 913 and the pass gates of the third selection circuit 923 in FIG. 9 may be substantially the same as the coupling relationships between the first to fourth inverters 1011 to 1014 and the first to eighth pass gates 1021 to 1028 in FIG. 10A.

Figure 10B:
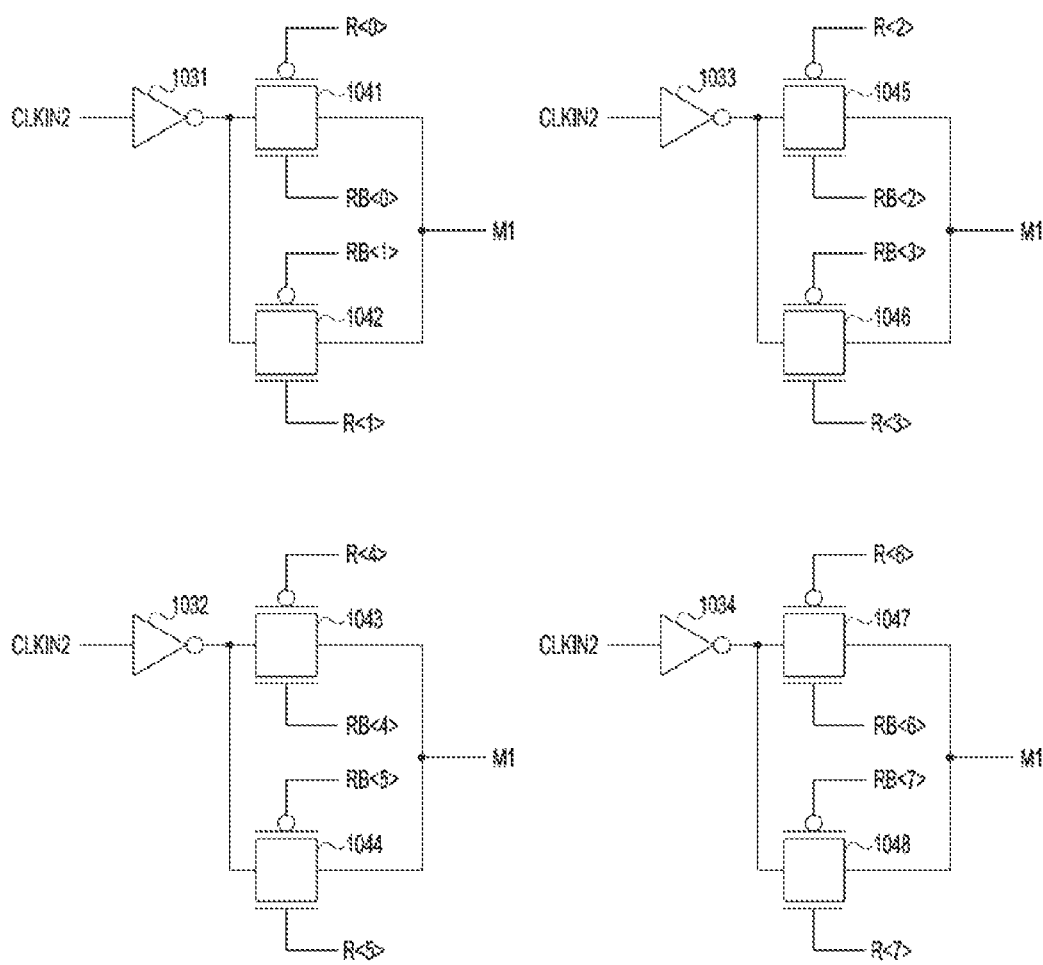
FIG. 10B is a diagram illustrating a coupling relationship between a second driver and a second selection circuit which are illustrated in FIG. 9.

FIG. 10B is a diagram illustrating a coupling relationship between the second driver 912 and the second selection circuit 922 which are illustrated in FIG. 9. The second driver 912 may include a first inverter 1031, a second inverter 1032, a third inverter 1033, and a fourth inverter 1034. The first to fourth inverters 1031 to 1034 may commonly receive the second clock signal CLKIN2, and invert the second clock signal CLKIN2. The second selection circuit 922 may include a first pass gate 1041, a second pass gate 1042, a third pass gate 1043, a fourth pass gate 1044, a fifth pass gate 1045, a sixth pass gate 1046, a seventh pass gate 1047, and an eighth pass gate 1048. The first and second pass gates 1041 and 1042 may be coupled between the first inverter 1031 and the first mixing node M1. The third and fourth pass gates 1043 and 1044 may be coupled between the second inverter 1032 and the first mixing node M1. The fifth and sixth pass gates 1045 and 1046 may be coupled between the third inverter 1033 and the first mixing node M1. The seventh and eighth pass gates 1047 and 1048 may be coupled between the fourth inverter 1034 and the first mixing node M1. The weight R<0:7> and the inverted signal RB<0:7> of the weight, which are received by the first to eighth pass gates 1041 to 1048 of the second selection circuit 922, may be complementary with the weight R<0:7> and the inverted signal RB 0:7> of the weight, which are received by the first to eighth pass gates 1021 to 1028 of the first selection circuit 921 illustrated in FIG. 10A.

The first bit RB<0> of the inverted signal of the weight may be allocated to the first pass gate 1041, and the second bit R<1> of the weight may be allocated to the second pass gate 1042. The first pass gate 1041 may couple an output terminal of the first inverter 1031 to the first mixing node M1 on the basis of the first bit RB<0> of the inverted signal of the weight and the first bit R<0> of the weight. The first pass gate 1041 may be turned on when the first bit RB<0> of the inverted signal of the weight is at a high logic level. The second pass gate 1042 may couple the output terminal of the first inverter 1031 to the first mixing node M1 on the basis of the second bit R<1> of the weight and the second bit RB<1> of the inverted signal of the weight. The second pass gate 1042 may be turned on when the second bit R<1> of the weight is at a high logic level.

The fifth bit RB<4> of the inverted signal of the weight may be allocated to the third pass gate 1043, and the sixth bit R<5> of the weight may be allocated to the fourth pass gate 1044. The third pass gate 1043 may couple an output terminal of the second inverter 1032 to the first mixing node M1 on the basis of the fifth bit RB<4> of the inverted signal of the weight and the fifth bit R<4> of the weight. The third pass gate 1043 may be turned on when the fifth bit RB<4> of the inverted signal of the weight is at a high logic level. The fourth pass gate 1044 may couple the output terminal of the second inverter 1032 to the first mixing node M1 on the basis of the sixth bit R<5> of the weight and the sixth bit RB<5> of the inverted signal of the weight. The fourth pass gate 1044 may be turned on when the sixth bit R<5> of the weight is at a high logic level.

The third bit RB<2> of the inverted signal of the weight may be allocated to the fifth pass gate 1045, and the fourth bit R<3> of the weight may be allocated to the sixth pass gate 1046. The fifth pass gate 1045 may couple an output terminal of the third inverter 1033 to the first mixing node M1 on the basis of the third bit RB<2> of the inverted signal of the weight and the third bit R<2> of the weight. The fifth pass gate 1045 may be turned on when the third bit RB<2> of the inverted signal of the weight is at a high logic level. The sixth pass gate 1046 may couple the output terminal of the third inverter 1033 to the first mixing node M1 on the basis of the fourth bit R<3> of the weight and the fourth bit RB<3> of the inverted signal of the weight. The sixth pass gate 1046 may be turned on when the fourth bit R<3> of the weight is at a high logic level.

The seventh bit RB<6> of the inverted signal of the weight may be allocated to the seventh pass gate 1047, and the eighth bit R<7> of the weight may be allocated to the eighth pass gate 1048. The seventh pass gate 1047 may couple an output terminal of the fourth inverter 1034 to the first mixing node M1 on the basis of the seventh bit RB<6> of the inverted signal of the weight and the seventh bit R<6> of the weight. The seventh pass gate 1047 may be turned on when the seventh bit RB<6> of the inverted signal of the weight is at a high logic level. The eighth pass gate 1048 may couple an output terminal of the fourth inverter 1034 to the first mixing node M1 on the basis of the eighth bit R<7> of the weight and the eighth bit RB<7> of the inverted signal of the weight. The eighth pass gate 1048 may be turned on when the eighth bit R<7> of the weight is at a high logic level.

The coupling relationships between the inverters of the fourth driver 914 and the pass gates of the fourth selection circuit 924 in FIG. 9 may be substantially the same as the coupling relationships between the first to fourth inverters 1031 to 1034 and the first to eighth pass gates 1041 to 1048 in FIG. 10b.

Figure 11A:
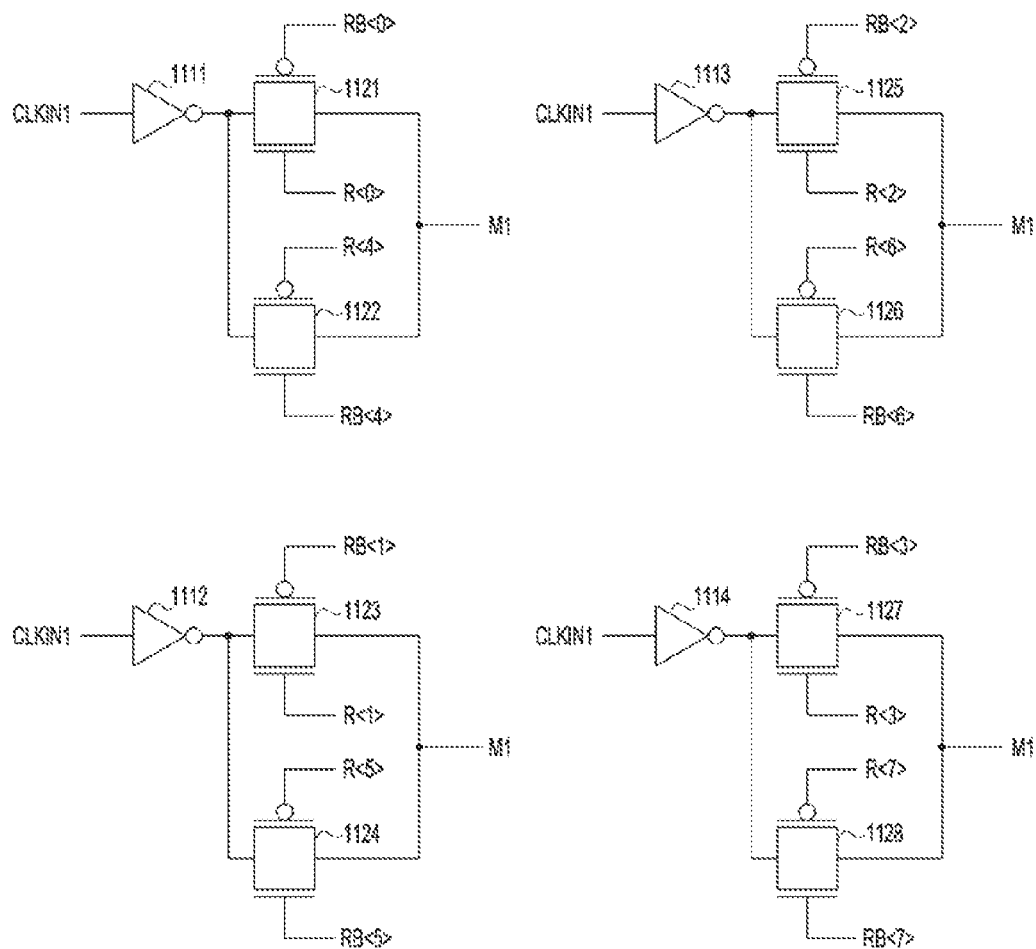
FIG. 11A is a diagram illustrating a coupling relationship between the first driver and the first selection circuit which are illustrated in FIG. 9.

FIG. 11A is a diagram illustrating a coupling relationship between the first driver 911 and the first selection circuit 921 which are illustrated in FIG. 9. The first driver 911 may include a first inverter 1111, a second inverter 1112, a third inverter 1113, and a fourth inverter 1114. The first to fourth inverters 1111 to 1114 may commonly receive the first clock signal CLKIN1, and invert the first clock signal CLKIN1. The first selection circuit 921 may include a first pass gate 1121, a second pass gate 1122, a third pass gate 1123, a fourth pass gate 1124, a fifth pass gate 1125, a sixth pass gate 1126, a seventh pass gate 1127, and an eighth pass gate 1128. The first and second pass gates 1121 and 1122 may be coupled between the first inverter 1111 and the first mixing node M1. The third and fourth pass gates 1123 and 1124 may be coupled between the second inverter 1112 and the first mixing node M1. The fifth and sixth pass gates 1125 and 1126 may be coupled between the third inverter 1113 and the first mixing node M1. The seventh and eighth pass gates 1127 and 1128 may be coupled between the fourth inverter 1114 and the first mixing node M1.

The first bit R<0> of the weight may be allocated to the first pass gate 1121, and the fifth bit RB<4> of the inverted signal of the weight may be allocated to the second pass gate 1122. The first pass gate 1121 may couple an output terminal of the first inverter 1111 to the first mixing node M1 on the basis of the first bit R<0> of the weight and the first bit RB<0> of the inverted signal of the weight. The first pass gate 1121 may be turned on when the first bit R<0> of the weight is at a high logic level. The second pass gate 1122 may couple the output terminal of the first inverter 1111 to the first mixing node M1 on the basis of the fifth bit RB<4> of the inverted signal of the weight and the fifth bit R<4> of the weight. The second pass gate 1122 may be turned on when the fifth bit RB<4> of the inverted signal of the weight is at a high logic level.

The second bit R<1> of the weight may be allocated to the third pass gate 1123, and the sixth bit RB<5> of the inverted signal of the weight may be allocated to the fourth pass gate 1124. The third pass gate 1123 may couple an output terminal of the second inverter 1112 to the first mixing node M1 on the basis of the second bit R<1> of the weight and the second bit RB<1> of the inverted signal of the weight. The third pass gate 1123 may be turned on when the second bit R<1> of the weight is at a high logic level. The fourth pass gate 1124 may couple the output terminal of the second inverter 1112 to the first mixing node M1 on the basis of the sixth bit RB<5> of the inverted signal of the weight and the sixth bit R<5> of the weight. The fourth pass gate 1124 may be turned on when the sixth bit RB<5> of the inverted signal of the weight is at a high logic level.

The third bit R<2> of the weight may be allocated to the fifth pass gate 1125, and the seventh bit RB<6> of the inverted signal of the weight may be allocated to the sixth pass gate 1126. The fifth pass gate 1125 may couple an output terminal of the third inverter 1113 to the first mixing node M1 on the basis of the third bit R<2> of the weight and the third bit RB<2> of the inverted signal of the weight. The fifth pass gate 1125 may be turned on when the third bit R<2> of the weight is at a high logic level. The sixth pass gate 1126 may couple the output terminal of the third inverter 1113 the first mixing node M1 on the basis of the seventh bit RB<6> of the inverted signal of the weight and the seventh bit R<6> of the weight. The sixth pass gate 1126 may be turned on when the seventh bit RB<6> of the inverted signal of the weight is at a high logic level.

The fourth bit R<3> of the weight may be allocated to the seventh pass gate 1127, and the eighth bit RB<7> of the inverted signal of the weight may be allocated to the eighth pass gate 1128. The seventh pass gate 1127 may couple an output terminal of the fourth inverter 1114 to the first mixing node M1 on the basis of the fourth bit R<3> of the weight and the fourth bit RB<3> of the inverted signal of the weight. The seventh pass gate 1127 may be turned on when the fourth bit R<3> of the weight is at a high logic level. The eighth pass gate 1128 may couple the output terminal of the fourth inverter 1114 to the first mixing node M1 on the basis of the eighth bit RB<7> of the inverted signal of the weight and the eighth bit R<7> of the weight. The eighth pass gate 1128 may be turned on when the eighth bit RB<7> of the inverted signal of the weight is at a high logic level.

The coupling relationships between the inverters of the third driver 913 and the pass gates of the third selection circuit 923 in FIG. 9 may be substantially the same as the coupling relationships between the first to fourth inverters 1111 to 1114 and the first to eighth pass gates 1121 to 1128 in FIG. 11A.

Figure 11B:
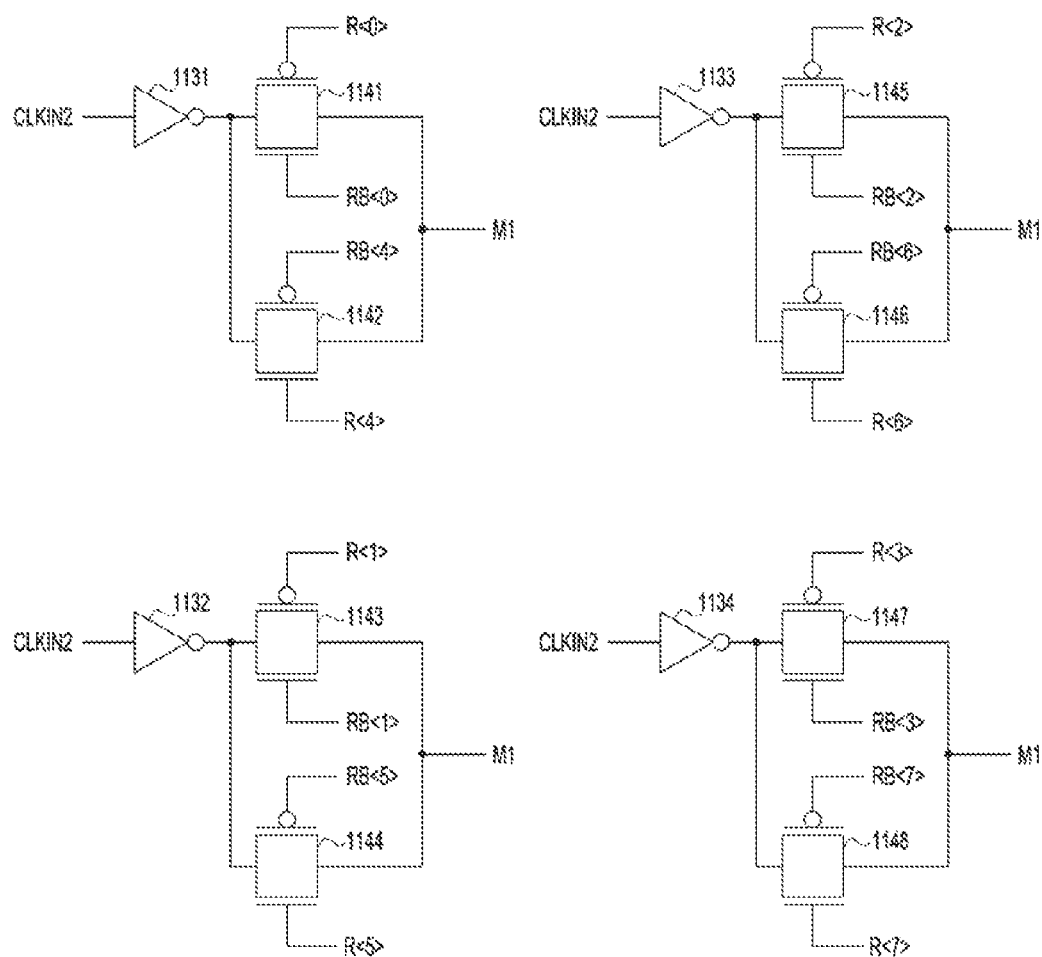
FIG. 11B is a diagram illustrating a coupling relationship between the second driver and the second selection circuit which are illustrated in FIG. 9.

FIG. 11B is a diagram illustrating a coupling relationship between the second driver 912 and the second selection circuit 922 which are illustrated in FIG. 9. The second driver 912 may include a first inverter 1131, a second inverter 1132, a third inverter 1133, and a fourth inverter 1134. The first to fourth inverters 1131 to 1134 may commonly receive the second clock signal CLKIN2, and invert the second clock signal CLKIN2. The second selection circuit 922 may include a first pass gate 1141, a second pass gate 1142, a third pass gate 1143, a fourth pass gate 1144, a fifth pass gate 1145, a sixth pass gate 1146, a seventh pass gate 1147, and an eighth pass gate 1148. The first and second pass gates 1141 and 1142 may be coupled between the first inverter 1131 and the first mixing node M1. The third and fourth pass gates 1143 and 1144 may be coupled between the second inverter 1132 and the first mixing node M1. The fifth and sixth pass gates 1145 and 1146 may be coupled between the third inverter 1133 and the first mixing node M1. The seventh and eighth pass gates 1147 and 1148 may be coupled between the fourth inverter 1134 and the first mixing node M1. The weight R<0:7> and the inverted signal RB<0:7> of the weight, which are received by the first to eighth pass gates 1141 to 1148 of the second selection circuit 922, may be complementary with the weight R<0:7> and the inverted signal RB<0:7> of the weight, which are received by the first to eighth pass gates 1121 to 1128 of the first selection circuit 921 illustrated in FIG. 11A.

The first bit RB<0> of the inverted signal of the weight may be allocated to the first pass gate 1141, and the fifth bit R<4> of the weight may be allocated to the second pass gate 1142. The first pass gate 1141 may couple an output terminal of the first inverter 1131 to the first mixing node M1 on the basis of the first bit RB<0> of the inverted signal of the weight and the first bit R<0> of the weight. The first pass gate 1141 may be turned on when the first bit RB<0> of the inverted signal of the weight is at a high logic level. The second pass gate 1142 may couple the output terminal of the first inverter 1131 to the first mixing node M1 on the basis of the fifth bit R<4> of the weight and the fifth bit RB<4> of the inverted signal of the weight. The second pass gate 1142 may be turned on when the fifth bit R<4> of the weight is at a high logic level.

The second bit RB<1> of the inverted signal of the weight may be allocated to the third pass gate 1143, and the sixth bit R<5> of the weight may be allocated to the fourth pass gate 1144. The third pass gate 1143 may couple an output terminal of the second inverter 1132 to the first mixing node M1 on the basis of the second bit RB<1> of the inverted signal of the weight and the second bit R<1> of the weight. The third pass gate 1143 may be turned on when the second bit RB<1> of the inverted signal of the weight is at a high logic level. The fourth pass gate 1144 may couple the output terminal of the second inverter 1132 to the first mixing node M1 on the basis of the sixth bit R<5> of the weight and the sixth bit RB<5> of the inverted signal of the weight. The fourth pass gate 1144 may be turned on when the sixth bit R<5> of the weight is at a high logic level.

The third bit RB<2> of the inverted signal of the weight may be allocated to the fifth pass gate 1145, and the seventh bit R<6> of the weight may be allocated to the sixth pass gate 1146. The fifth pass gate 1145 may couple an output terminal of the third inverter 1133 to the first mixing node M1 on the basis of the third bit RB<2> of the inverted signal of the weight and the third bit R<2> of the weight. The fifth pass gate 1145 may be turned on when the third bit RB<2> of the inverted signal of the weight is at a high logic level. The sixth pass gate 1146 may couple the output terminal of the third inverter 1133 to the first mixing node M1 on the basis of the seventh bit R<6> of the weight and the seventh bit RB<6> of the inverted signal of the weight. The sixth pass gate 1146 may be turned on when the seventh bit R<6> of the weight is at a high logic level.

The fourth bit RB<3> of the inverted signal of the weight may be allocated to the seventh pass gate 1147, and the eighth bit R<7> of the weight may be allocated to the eighth pass gate 1148. The seventh pass gate 1147 may couple an output terminal of the fourth inverter 1134 to the first mixing node M1 on the basis of the fourth bit RB<3> of the inverted signal of the weight and the fourth bit R<3> of the weight. The seventh pass gate 1147 may be turned on when the fourth bit RB<3> of the inverted signal of the weight is at a high logic level. The eighth pass gate 1148 may couple the output terminal of the fourth inverter 1134 to the first mixing node M1 on the basis of the eighth bit R<7> of the weight and the eighth bit RB<7> of the inverted signal of the weight. The eighth pass gate 1148 may be turned on when the eighth bit R<7> of the weight is at a high logic level.

The coupling relationships between the inverters of the fourth driver 914 and the pass gates of the fourth selection circuit 924 in FIG. 9 may be substantially the same as the coupling relationships between the first to fourth inverters 1131 to 1134 and the first to eighth pass gates 1141 to 1148 in FIG. 11B.

What is claimed is:
1. A phase mixing circuit comprising:
a first driver comprising 2n inverters configured to drive a first clock signal, where n is a positive integer;
a first selection circuit configured to couple each of the 2n inverters of the first driver to a first mixing node, on the basis of a weight having first to $2n^{th}$ bits;
a second driver comprising 2n inverters configured to drive a second clock signal; and a second selection circuit configured to couple each of the 2n inverters of the second driver to the first mixing node, on the basis of an inverted signal of the weight.

2. The phase mixing circuit according to claim 1, wherein:
the first selection circuit comprises 2n pass gates coupled one-to-one to the 2n inverters of the first driver, and configured to couple the 2n inverters of the first driver to the first mixing node on the basis of the first to $2n^{th}$ bits of the weight, respectively; and
the second selection circuit comprises 2n pass gates coupled one-to-one to the 2n inverters of the second driver, and configured to couple the 2n inverters of the second driver to the first mixing node on the basis of the first to $2n^{th}$ bits of the inverted signal of the weight, respectively.

3. The phase mixing circuit according to claim 1, further comprising:
a third driver comprising 2n inverters configured to drive a complementary signal of the first clock signal;
a third selection circuit configured to couple each of the 2n inverters of the third driver to a second mixing node on the basis of the weight;
a fourth driver comprising 2n inverters configured to drive a complementary signal of the second clock signal;
a fourth selection circuit configured to couple each of the 2n inverters of the fourth driver to the second mixing node on the basis of the inverted signal of the weight; and
an output circuit configured to generate an output clock signal by mixing a first mixed signal from the first mixing node and a second mixed signal from the second mixing node.

4. The phase mixing circuit according to claim 3, wherein:
the third selection circuit comprises 2n pass gates coupled one-to-one to the 2n inverters of the third driver, and configured to couple the 2n inverters of the third driver to the second mixing node on the basis of the first to $2n^{th}$ bits of the weight, respectively; and
the fourth selection circuit comprises 2n pass gates coupled one-to-one to the 2n inverters of the fourth driver, and configured to couple the 2n inverters of the fourth driver to the second mixing node on the basis of the first to $2n^{th}$ bits of the inverted signal of the weight, respectively.

5. The phase mixing circuit according to claim 3, wherein the output circuit comprises:
a first inverter configured to invert the first mixed signal;
a second inverter configured to invert an output of the first inverter;
a third inverter configured to invert the second mixed signal; and
a fourth inverter configured to generate the output clock signal by mixing the phases of outputs of the second and third inverters at a ratio of 1:1.

6. The phase mixing circuit according to claim 3, further comprising:
a fifth inverter configured to generate a complementary signal of the first clock signal by inverting the first clock signal, and provide the complementary signal of the first clock signal to the third driver; and
a sixth inverter configured to generate a complementary signal of the second clock signal by inverting the second clock signal, and provide the complementary signal of the second clock signal to the fourth driver.

7. A phase mixing circuit comprising:
a first driver comprising n inverters configured to drive a first clock signal, where n is a positive integer;
a first selection circuit configured to couple each of the n inverters of the first driver to a first mixing node, on the basis of at least part of a weight having first to $2n^{th}$ bits and at least part of an inverted signal of the weight;
a second driver comprising n inverters configured to drive a second clock signal; and
a second selection circuit configured to couple each of the n inverters of the second driver to the first mixing node, on the basis of at least part of the weight and at least part of the inverted signal of the weight.

8. The phase mixing circuit according to claim 7, wherein the first selection circuit comprises:
a first set of n pass gates coupled one-to-one to the n inverters of the first driver, and configured to couple the n inverters of the first driver to the first mixing node on the basis of odd bits of the weight, respectively; and
a second set of n pass gates coupled one-to-one to the n inverters of the first driver, and configured to couple the n inverters of the first driver to the first mixing node on the basis of even bits of the inverted signal of the weight, respectively.

9. The phase mixing circuit according to claim 8, wherein the second selection circuit comprises:
a third set of n pass gates coupled one-to-one to the n inverters of the second driver, and configured to couple the n inverters of the second driver to the first mixing node on the basis of odd bits of the inverted signal of the weight, respectively, and
a fourth set of n pass gates coupled one-to-one to the n inverters of the second driver, and configured to couple the n inverters of the second driver to the first mixing node on the basis of even bits of the weight, respectively.

10. The phase mixing circuit according to claim 7, wherein the first selection circuit comprises:
a first set of n pass gates coupled one-to-one to the n inverters of the first driver, and configured to couple the n inverters of the first driver to the first mixing node on the basis of lower bits of the weight, respectively, and
a second set of n pass gates coupled one-to-one to the n inverters of the first driver, and configured to couple the n inverters of the first driver to the first mixing node on the basis of upper bits of the inverted signal of the weight, respectively.

11. The phase mixing circuit according to claim 10, wherein the second selection circuit comprises:
a third set of n pass gates coupled one-to-one to the n inverters of the second driver, and configured to couple the n inverters of the second driver to the first mixing node on the basis of lower bits of the inverted signal of the weight, respectively, and
a fourth set of n pass gates coupled one-to-one to the n inverters of the second driver, and configured to couple the n inverters of the second driver to the first mixing node on the basis of upper bits of the weight, respectively.

12. The phase mixing circuit according to claim 7, further comprising:
a third driver comprising n inverters configured to drive a complementary signal of a first clock signal;
a third selection circuit configured to couple each of the n inverters of the third driver to a second mixing node, on the basis of at least part of the weight and at least part of the inverted signal of the weight;
a fourth driver comprising n inverters configured to drive a complementary signal of a second clock signal;

a fourth selection circuit configured to couple each of the n inverters of the fourth driver to the second mixing node, on the basis of at least part of the weight and at least part of the inverted signal of the weight; and an output circuit configured to generate an output clock signal by mixing a first mixed signal from the first mixing node and a second mixed signal from the second mixing node.

13. The phase mixing circuit according to claim 12, wherein the third selection circuit comprises:
a fifth set of n pass gates coupled one-to-one to the n inverters of the third driver, and configured to couple the n inverters of the third driver to the second mixing node on the basis of odd bits of the weight, respectively, and a sixth set of n pass gates coupled one-to-one to the n inverters of the third driver, and configured to couple the n inverters of the third driver to the first mixing node on the basis of even bits of the inverted signal of the weight, respectively.

14. The phase mixing circuit according to claim 13, wherein the fourth selection circuit comprises:
a seventh set of n pass gates coupled one-to-one to the n inverters of the fourth driver, and configured to couple the n inverters of the fourth driver to the second mixing node on the basis of odd bits of the inverted signal of the weight, respectively, and an eighth set of n pass gates coupled one-to-one to the n inverters of the fourth driver, and configured to couple the n inverters of the fourth driver to the second mixing node on the basis of even bits of the weight, respectively.

15. The phase mixing circuit according to claim 12, wherein the third selection circuit comprises:
a fifth set of n pass gates coupled one-to-one to the n inverters of the third driver, and configured to couple the n inverters of the third driver to the second mixing node on the basis of lower bits of the weight, respectively, and a sixth set of n pass gates coupled one-to-one to the n inverters of the third driver, and configured to couple the n inverters of the third driver to the second mixing node on the basis of upper bits of the inverted signal of the weight, respectively.

16. The phase mixing circuit according to claim 15, wherein the fourth selection circuit comprises:
a seventh set of n pass gates coupled one-to-one to the n inverters of the fourth driver, and configured to couple the n inverters of the fourth driver to the second mixing node on the basis of lower bits of the inverted signal of the weight, respectively, and an eighth set of n pass gates coupled one-to-one to the n inverters of the fourth driver, and configured to couple the n inverters of the fourth driver to the second mixing node on the basis of upper bits of the weight, respectively.

17. The phase mixing circuit according to claim 12, wherein the output circuit comprises:
a first inverter configured to invert the first mixed signal;
a second inverter configured to invert an output of the first inverter;
a third inverter configured to invert the second mixed signal; and
a fourth inverter configured to generate the output clock signal by mixing the phases of outputs of the second and third inverters at a ratio of 1:1.

18. The phase mixing circuit according to claim 12, further comprising:
a fifth inverter configured to generate a complementary signal of the first clock signal by inverting the first clock signal, and provide the complementary signal of the first clock signal to the third driver; and
a sixth inverter configured to generate a complementary signal of the second clock signal by inverting the second clock signal, and provide the complementary signal of the second clock signal to the fourth driver.

* * * * *